(12) United States Patent
Yamaoka et al.

(10) Patent No.: US 11,658,155 B2
(45) Date of Patent: May 23, 2023

(54) SEMICONDUCTOR STORAGE DEVICE

(71) Applicant: KIOXIA CORPORATION, Tokyo (JP)

(72) Inventors: Masashi Yamaoka, Yokohama Kanagawa (JP); Kazuhiro Tomishige, Yokkaichi Mie (JP); Naoki Yamamoto, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 120 days.

(21) Appl. No.: 17/007,797

(22) Filed: Aug. 31, 2020

(65) Prior Publication Data
US 2021/0233895 A1 Jul. 29, 2021

(30) Foreign Application Priority Data
Jan. 23, 2020 (JP) .............................. JP2020-009505

(51) Int. Cl.
*H01L 27/1157* (2017.01)
*H01L 25/065* (2023.01)
(Continued)

(52) U.S. Cl.
CPC ............ *H01L 25/0657* (2013.01); *G11C 5/06* (2013.01); *G11C 16/0483* (2013.01); *H01L 23/5386* (2013.01); *H10B 43/35* (2023.02)

(58) Field of Classification Search
CPC .......... H01L 29/7808; H01L 27/11273; H01L 29/7802; H01L 29/66712; H01L 27/11517;
(Continued)

(56) References Cited

U.S. PATENT DOCUMENTS 7,696,559 B2 * 4/2010 Arai .................. H01L 29/66833
257/315
7,982,260 B2 * 7/2011 Fukuzumi ............. H01L 29/792
257/329
(Continued)

FOREIGN PATENT DOCUMENTS

JP 2017-157260 A 9/2017

*Primary Examiner* — Mary A Wilczewski
*Assistant Examiner* — Tsz K Chiu
(74) *Attorney, Agent, or Firm* — Foley & Lardner LLP

(57) ABSTRACT

A semiconductor storage device includes a substrate, a plurality of conductive layers arranged in a first direction intersecting a surface of the substrate, and a semiconductor layer extending in the first direction and penetrating the plurality of conductive layers. The plurality of conductive layers includes a first conductive layer and a second conductive layer that are adjacent to each other, a third conductive layer and a fourth conductive layer that are adjacent to each other, and a fifth conductive layer and a sixth conductive layer that are adjacent to each other. When a distance between the first conductive layer and the second conductive layer in the first direction is a first distance, a distance between the third conductive layer and the fourth conductive layer in the first direction is a second distance, and a distance between the fifth conductive layer and the sixth conductive layer in the first direction is a third distance, the second distance is smaller than the first distance, and the third distance is smaller than the second distance.

7 Claims, 21 Drawing Sheets

(51) Int. Cl.
*H01L 23/538* (2006.01)
*G11C 16/04* (2006.01)
*G11C 5/06* (2006.01)

(58) Field of Classification Search
CPC ............. H01L 29/788; H01L 29/42324; H01L 29/66825; H01L 29/792; H01L 2924/13081; H01L 2924/13085; H01L 29/6684; H01L 29/78391; H01L 29/4236; H01L 27/11524; H01L 27/1157; H01L 27/11578; H01L 27/11582; H01L 2924/13; H01L 29/783911; H01L 29/423; H01L 27/115

See application file for complete search history.

(56) References Cited

U.S. PATENT DOCUMENTS

| | | | | |
|---|---|---|---|---|
| 8,030,700 B2* | 10/2011 | Sakamoto | ......... | H01L 27/11578 257/306 |
| 8,072,024 B2* | 12/2011 | Ishikawa | ........... | H01L 27/11582 438/386 |
| 8,211,811 B2* | 7/2012 | Matsushita | ....... | H01L 29/66833 438/763 |
| 8,236,673 B2* | 8/2012 | Son | .................... | H01L 29/7926 438/259 |
| 8,338,876 B2* | 12/2012 | Kito | .................. | H01L 27/11551 257/314 |
| 8,349,681 B2* | 1/2013 | Alsmeier | .......... | H01L 29/66825 257/E21.309 |
| 8,415,242 B2* | 4/2013 | Mizushima | ......... | H01L 29/7926 257/E21.409 |
| 8,552,489 B2* | 10/2013 | Eom | ................... | H01L 29/7926 257/E21.21 |
| 8,658,499 B2* | 2/2014 | Makala | ............. | H01L 29/40117 257/334 |
| 8,829,595 B2* | 9/2014 | Lee | .................. | H01L 27/11582 257/E21.21 |
| 8,928,061 B2* | 1/2015 | Chien | ............... | H01L 21/32053 257/315 |
| 8,994,091 B2* | 3/2015 | Lee | .................... | H01L 29/7926 257/316 |
| 9,018,682 B2* | 4/2015 | Izumida | ............ | H01L 29/40117 257/234 |
| 9,076,879 B2* | 7/2015 | Yoo | ..................... | H01L 29/7926 |
| 9,099,496 B2* | 8/2015 | Tian | .................... | H01L 29/7889 |
| 9,159,739 B2* | 10/2015 | Makala | ............. | H01L 27/11556 |
| 9,236,396 B1* | 1/2016 | Koka | ................. | H01L 29/517 |
| 9,305,849 B1* | 4/2016 | Tsutsumi | ............ | H01L 27/1157 |
| 9,312,008 B2* | 4/2016 | Nam | .................. | G11C 16/3459 |
| 9,406,694 B1* | 8/2016 | Ikeno | ............... | H01L 29/66833 |
| 9,634,024 B2* | 4/2017 | Kanamori | ........... | H01L 27/1157 |
| 9,659,958 B2* | 5/2017 | Lee | ................... | H01L 27/11582 |
| 9,666,296 B1 | 5/2017 | Maejima | | |
| 10,062,653 B2* | 8/2018 | Ito | ..................... | H01L 29/7845 |
| 10,068,917 B2* | 9/2018 | Kanamori | ......... | H01L 27/11582 |
| 10,121,798 B2* | 11/2018 | Lim | ...................... | H01L 23/528 |
| 10,164,009 B1* | 12/2018 | Carlson | ............ | H01L 27/11556 |
| 10,276,583 B2* | 4/2019 | Sharangpani | ....... | H01L 27/1052 |
| 10,340,286 B2* | 7/2019 | Goda | ................ | H01L 27/11582 |
| 10,388,662 B2* | 8/2019 | Horiguchi | .......... | H01L 21/02164 |
| 10,388,667 B2* | 8/2019 | Carlson | .............. | H01L 29/7926 |
| 10,446,572 B2* | 10/2019 | Carlson | ............ | H01L 27/11582 |
| 10,453,855 B2* | 10/2019 | Carlson | .............. | H01L 27/1157 |
| 10,566,346 B2* | 2/2020 | Lee | ................... | H01L 27/11568 |
| 2008/0173928 A1* | 7/2008 | Arai | .................... | H01L 29/7926 257/E21.409 |
| 2010/0019310 A1* | 1/2010 | Sakamoto | ............. | H01L 29/792 257/324 |
| 2010/0038699 A1* | 2/2010 | Katsumata | ........ | H01L 29/66833 257/E21.409 |
| 2012/0012920 A1* | 1/2012 | Shin | ..................... | H01L 29/4234 257/E29.262 |
| 2012/0091521 A1* | 4/2012 | Goda | ................. | H01L 29/66666 257/E29.17 |
| 2012/0098050 A1* | 4/2012 | Shim | .................. | H01L 27/11578 257/E29.262 |
| 2012/0140562 A1* | 6/2012 | Choe | .................... | H01L 27/1157 257/329 |
| 2012/0181603 A1* | 7/2012 | Ahn | ....................... | H10B 41/20 257/329 |
| 2012/0267702 A1* | 10/2012 | Jee | .................... | H01L 27/11582 257/E21.423 |
| 2013/0134493 A1* | 5/2013 | Eom | .................... | H01L 29/7926 257/314 |
| 2013/0270625 A1* | 10/2013 | Jang | ................... | H01L 29/7926 257/324 |
| 2013/0270643 A1* | 10/2013 | Lee | ..................... | H01L 27/1052 257/365 |
| 2014/0203442 A1* | 7/2014 | Yun | ................... | H01L 27/11548 257/773 |
| 2015/0060993 A1* | 3/2015 | Lee | ................... | H01L 27/11565 257/324 |
| 2015/0294980 A1* | 10/2015 | Lee | .................. | H01L 21/76877 438/591 |
| 2016/0027796 A1* | 1/2016 | Yang | ....................... | H10B 43/27 257/314 |
| 2016/0071957 A1* | 3/2016 | Oshiki | ............. | H01L 21/32134 438/703 |
| 2016/0300848 A1* | 10/2016 | Pachamuthu | ..... | H01L 27/11582 |
| 2017/0221921 A1* | 8/2017 | Kanamori | ......... | H01L 29/42344 |
| 2017/0236835 A1* | 8/2017 | Nakamura | .............. | H01L 28/00 257/314 |
| 2018/0033798 A1* | 2/2018 | Baraskar | ........... | H01L 21/02164 |
| 2018/0175054 A1* | 6/2018 | Baraskar | ........... | H01L 27/11582 |
| 2018/0277555 A1* | 9/2018 | Fukushima | ....... | H01L 27/11556 |
| 2018/0294272 A1* | 10/2018 | Fan | ................... | H01L 27/11556 |
| 2019/0198520 A1* | 6/2019 | Kim | ................. | H01L 29/66833 |
| 2019/0326318 A1* | 10/2019 | Jung | ................. | H01L 29/4234 |
| 2020/0312867 A1* | 10/2020 | Xiao | ................. | G11C 16/0483 |
| 2020/0411544 A1* | 12/2020 | Wang | ................ | H01L 27/11582 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2020-009505, filed Jan. 23, 2020; the entire contents of which are incorporated herein by reference.

FIELD

Embodiments described herein relate generally to a semiconductor storage device.

BACKGROUND

A semiconductor storage device including a substrate, a plurality of conductive layers arranged in a first direction intersecting a surface of the substrate and extending in a second direction intersecting the first direction, and a semiconductor layer extending in the first direction and penetrating the plurality of conductive layers, is known.

Examples of related art include JP-A-2017-157260.

DETAILED DESCRIPTION

Figure 1:
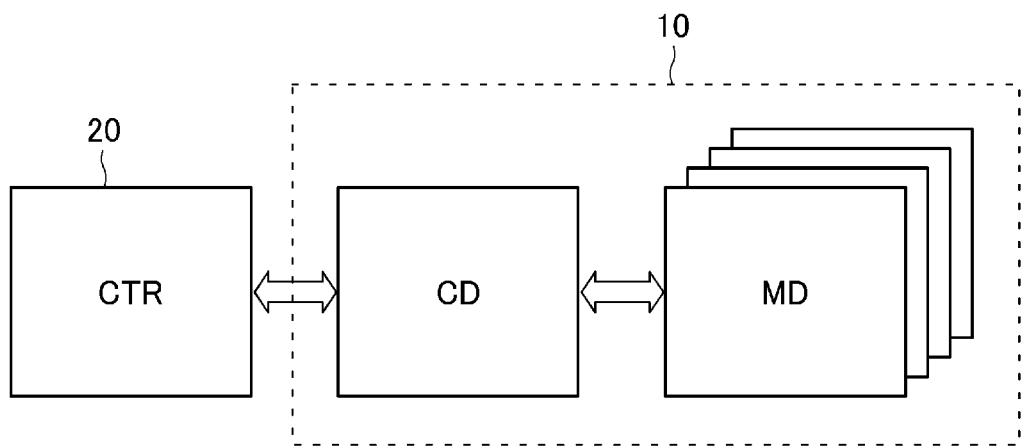
FIG. 1 is a schematic block diagram showing a configuration of a memory system according to a first embodiment.

At least one embodiment provides a semiconductor storage device which can be easily highly integrated.

In general, according to at least one embodiment, a semiconductor storage device includes a substrate, a plurality of conductive layers arranged in a first direction intersecting a surface of the substrate and extending in a second direction intersecting the first direction, and a semiconductor layer extending in the first direction and penetrating the plurality of conductive layers. The semiconductor layer includes a first part disposed between one end portion of the semiconductor layer in the first direction and the other end portion of the semiconductor layer in the first direction, and having a width in the second direction larger than a first width, a second part disposed between the first part and the other end portion, and having a width in the second direction smaller than the first width and larger than a second width, and a third part disposed between the second part and the other end portion, and having a width in the second direction smaller than the second width. The plurality of conductive layers include a first conductive layer facing the first part, a second conductive layer adjacent to the first conductive layer in the first direction, a third conductive layer facing the second part, a fourth conductive layer adjacent to the third conductive layer in the first direction, a fifth conductive layer facing the third part, and a sixth conductive layer adjacent to the fifth conductive layer in the first direction. When a distance between the first conductive layer and the second conductive layer in the first direction is a first distance, a distance between the third conductive layer and the fourth conductive layer in the first direction is a second distance, and a distance between the fifth conductive layer and the sixth conductive layer in the first direction is a third distance, the second distance is smaller than the first distance, and the third distance is smaller than the second distance.

According to at least one embodiment, a semiconductor storage device includes a substrate, a plurality of conductive layers arranged in a first direction intersecting a surface of the substrate, extending in a second direction intersecting the first direction, and functioning as a gate electrode of a memory transistor, and a semiconductor layer extending in the first direction and penetrating the plurality of conductive layers. The semiconductor layer includes a first part disposed between one end portion of the semiconductor layer in the first direction and the other end portion of the semiconductor layer in the first direction, and has a width in the second direction larger than a first width, and a second part disposed between the first part and the other end portion, having a width in the second direction smaller than the first width. The plurality of conductive layers includes a first conductive layer facing the first part, a second conductive layer adjacent to the first conductive layer in the first direction, a third conductive layer adjacent to the second conductive layer in the first direction, a fourth conductive layer facing the second part, a fifth conductive layer adjacent to the fourth conductive layer in the first direction, and a sixth conductive layer adjacent to the fifth conductive layer in the first direction. When a distance between the first conductive layer and the second conductive layer in the first direction is a first distance, a distance between the second conductive layer and the third conductive layer in the first direction is a second distance, a distance between the fourth conductive layer and the fifth conductive layer in the first direction is a third distance, and a distance between the fifth conductive layer and the sixth conductive layer in the first direction is a fourth distance, the third distance and the fourth distance are smaller than the first distance and the second distance.

Next, a semiconductor storage device according to at least one embodiment will be described in detail with reference to the drawings. The following embodiments are merely examples, and are not intended to limit the present disclosure. The following drawings are schematic, and a part of configurations and the like may be omitted for convenience of description. The same reference numerals are given to the common parts in a plurality of embodiments, and the description may be omitted.

In this specification, when a term "semiconductor storage device" is used, the semiconductor storage device may mean a memory die or a memory system that includes a control die, such as a memory chip, a memory card, and an SSD. Furthermore, the semiconductor storage device may mean a configuration that includes a host computer, such as a smart phone, a tablet terminal, and a personal computer.

In the present specification, when a first configuration is said to be "electrically connected" to a second configuration, the first configuration may be directly connected to the second configuration, or the first configuration may be connected to the second configuration via a wiring, a semiconductor member, a transistor, or the like. For example, when three transistors are connected in series, a first transistor is "electrically connected" to a third transistor even if a second transistor is in an OFF state.

In the present specification, when the first configuration is said to be "connected between" the second configuration and the third configuration, it may mean that the first configuration, the second configuration, and the third configuration are connected in series, and the first configuration is provided in current paths of the second configuration and the third configuration.

In the present specification, when a circuit or the like is said to "conduct" two wirings or the like, for example, it may mean that the circuit or the like includes a transistor or the like, and the transistor or the like is provided in a current path between the two wirings, and the transistor or the like is in an ON state.

In the present specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In the specification, a direction along a predetermined plane may be referred to as a first direction, a direction intersecting the first direction along the predetermined plane may be referred to as a second direction, and a direction intersecting the predetermined plane may be referred to as a third direction. Any one of the first direction, the second direction, and the third direction may or may not correspond to any one of the X direction, the Y direction, and the Z direction.

In the specification, expressions such as "above" and "below" are based on the substrate. For example, a direction away from the substrate along the Z direction is referred to as "above", and a direction approaching the substrate along the Z direction is referred to as "below". When referring to a lower surface or a lower end for a certain configuration, it means a surface or an end portion on a substrate side of the configuration, and when referring to an upper surface or an upper end, it means a surface or an end portion on a side opposite to the substrate of the configuration. A surface intersecting the X direction or the Y direction is referred to as a side surface or the like.

In the present specification, when referring to "width" or "thickness" in a predetermined direction for a configuration, a member, and the like, it may mean the width or the thickness of a cross section or the like observed by scanning electron microscopy (SEM), transmission electron microscopy (TEM) or the like.

First Embodiment

FIG. 1 is a schematic block diagram showing a configuration of a memory system 10 according to a first embodiment.

The memory system 10 reads, writes, and erases user data in response to a signal transmitted from a host computer 20. The memory system 10 is a system capable of storing, for example, a memory chip, a memory card, an SSD, or other user data. The memory system 10 includes a plurality of memory dies MD that store the user data, and a control die CD connected to the plurality of memory dies MD and the host computer 20. The control die CD includes, for example, a processor, a RAM, and the like, and performs processing such as conversion of a logical address and a physical address, bit error detection/correction, garbage collection (compaction), and wear leveling.

Figure 2:
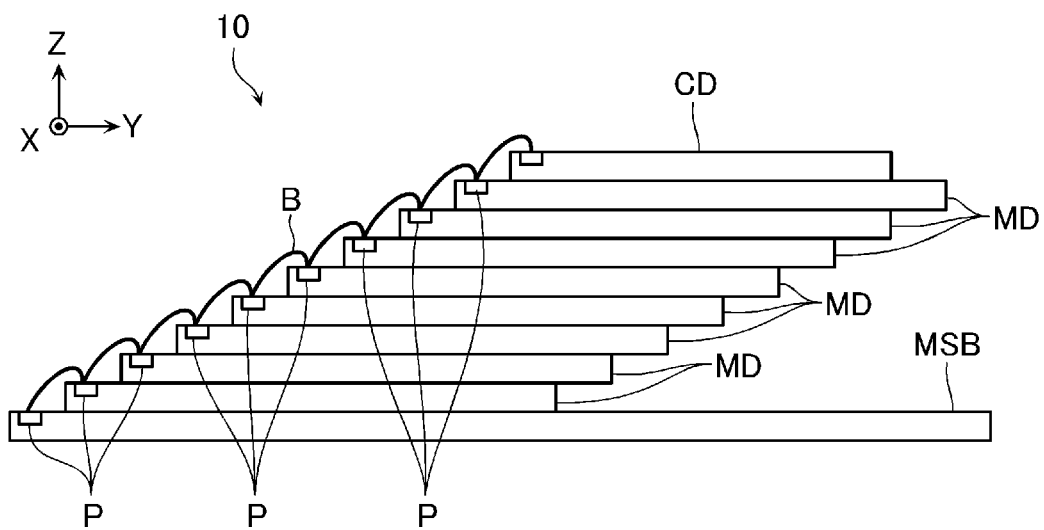
FIG. 2 is a schematic side view showing a configuration example of the memory system.
Figure 3:
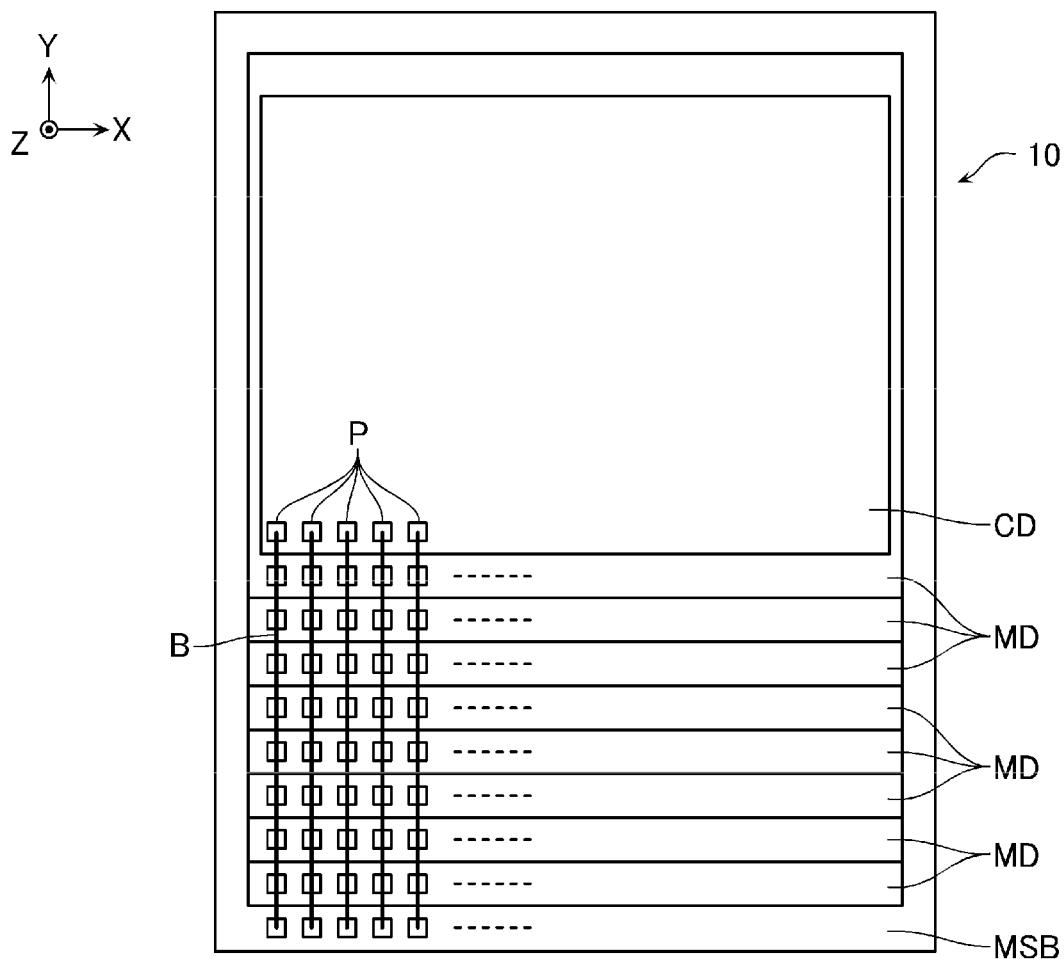
FIG. 3 is a schematic plan view showing the configuration example.

FIG. 2 is a schematic side view showing a configuration example of the memory system 10 according to the present embodiment. FIG. 3 is a schematic plan view showing the configuration example. For convenience of explanation, a part of the configuration is omitted in FIGS. 2 and 3.

As shown in FIG. 2, the memory system 10 according to at least one embodiment includes a mounting substrate MSB, the plurality of memory dies MD stacked on the substrate MSB, and the control die CD stacked on the memory die MD. A pad electrode P is provided in a region of an end portion in the Y direction on an upper surface of the mounting substrate MSB, and a region of another portion is connected to a lower surface of the memory die MD via an adhesive or the like. A pad electrode P is provided in a region of an end portion in the Y direction on an upper surface of the memory die MD, and a region of another portion is connected to a lower surface of another memory die MD or the control die CD via the adhesive or the like. A pad electrode P is provided in a region of an end portion in the Y direction on an upper surface of the control die CD.

As shown in FIG. 3, each of the mounting substrate MSB, the plurality of memory dies MD, and the control die CD includes a plurality of pad electrodes P arranged in the X direction. The plurality of pad electrodes P provided on the mounting substrate MSB, the plurality of memory dies MD, and the control die CD are connected to one another via bonding wires B.

Figure 4:
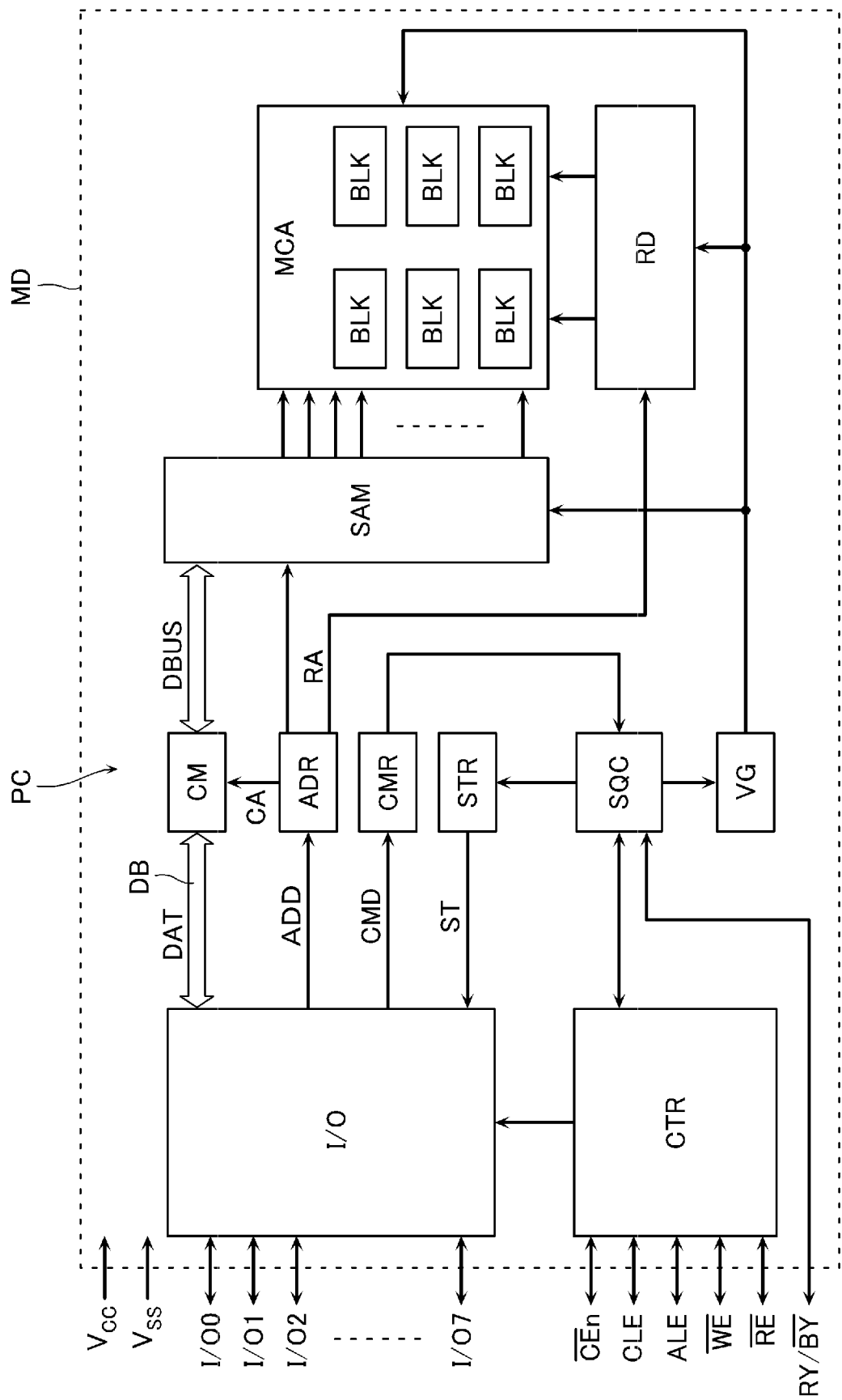
FIG. 4 is a schematic block diagram showing a configuration of a memory die MD according to the first embodiment.
Figure 5:
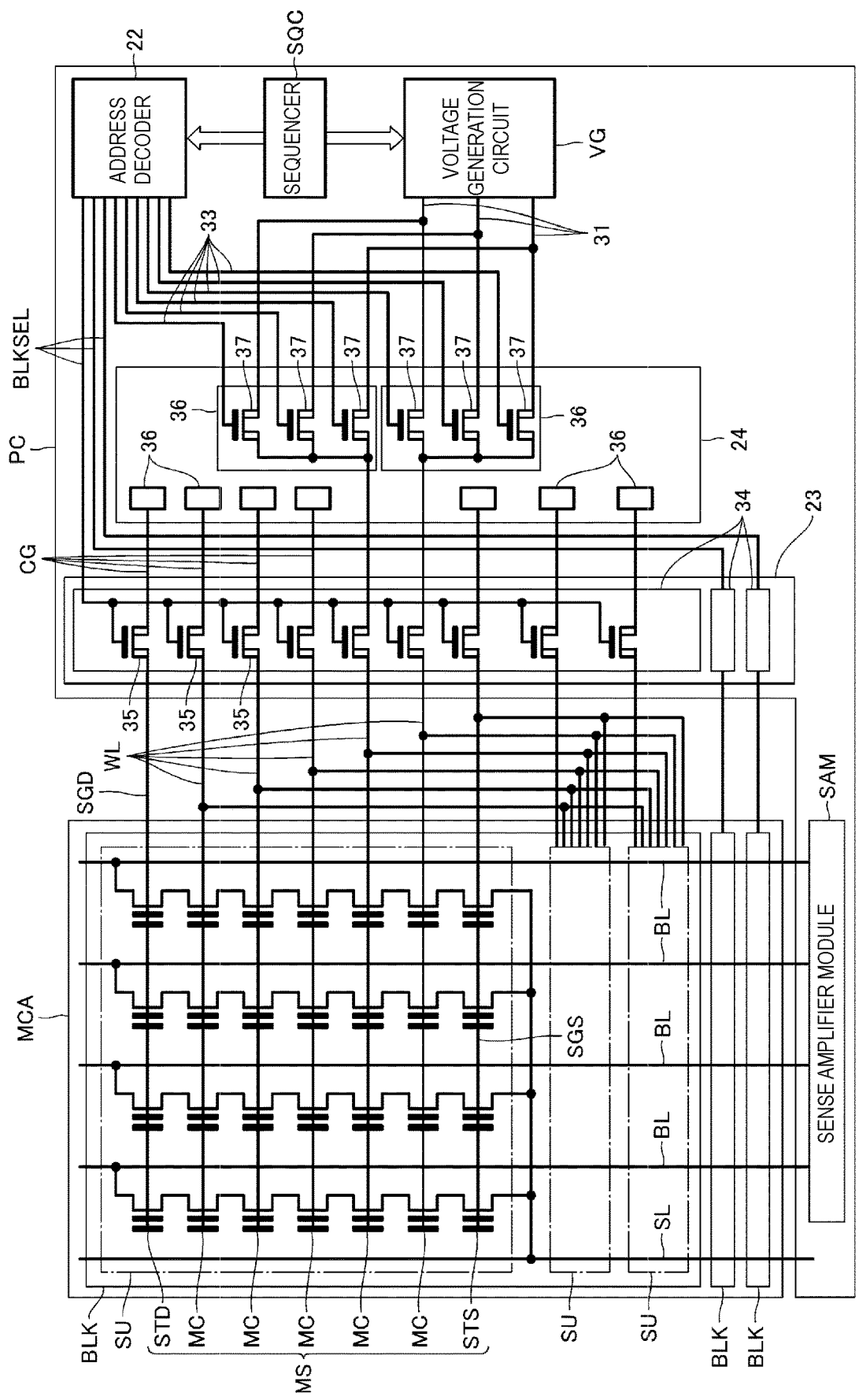
FIG. 5 is a schematic circuit diagram showing a configuration of a part of the memory die MD.
Figure 6:
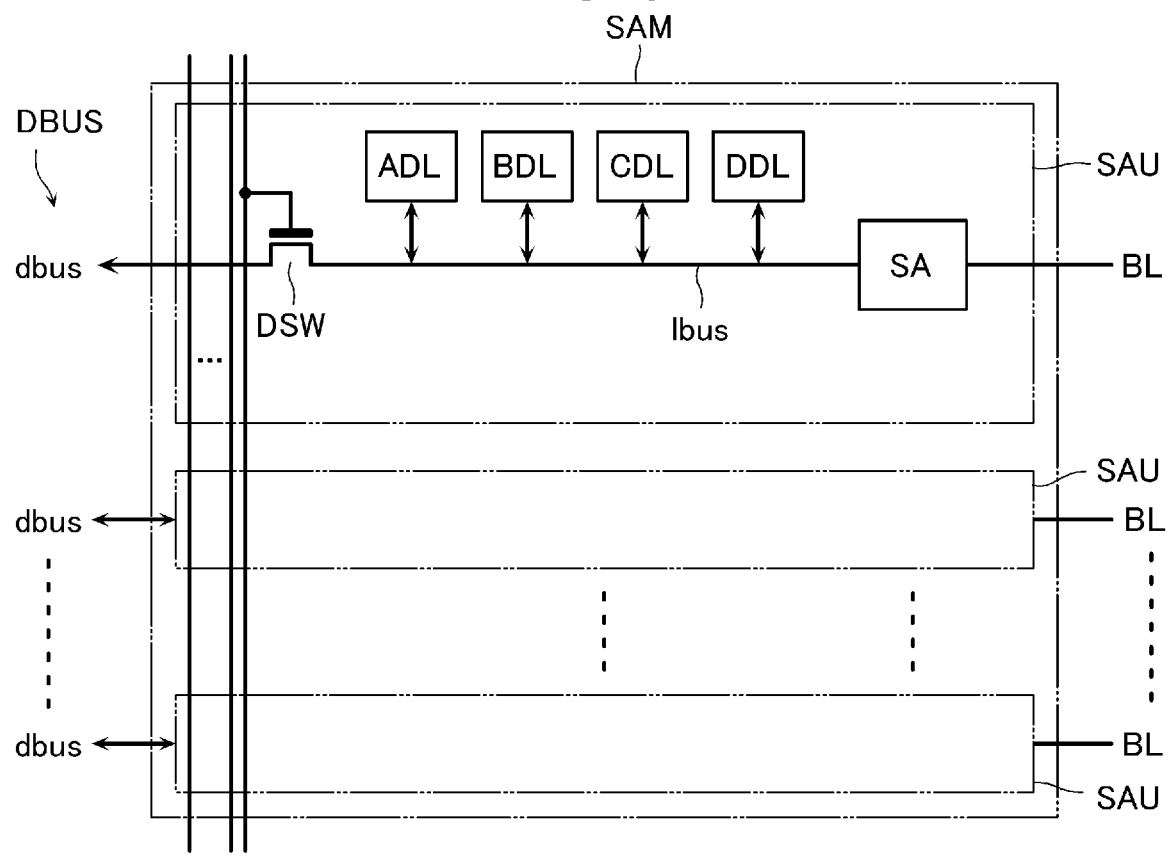
FIG. 6 is a schematic block diagram showing a configuration of a part of the memory die MD.

FIG. 4 is a schematic block diagram showing a configuration of the memory die MD according to the first embodiment. FIG. 5 is a schematic circuit diagram showing a configuration of a part of the memory die MD. FIG. 6 is a schematic block diagram showing a configuration of a part of the memory die MD.

As shown in FIG. 4, the memory die MD includes a memory cell array MCA that stores data, and a peripheral circuit PC connected to the memory cell array MCA.

As shown in FIG. 5, the memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. The other end of each of the plurality of memory strings MS is connected to the peripheral circuit PC via a common source line SL.

The memory string MS includes a drain side select transistor STD, a plurality of memory cells MC (memory transistors), and a source side select transistor STS that are connected in series between the bit line BL and the source line SL. Hereinafter, the drain side select transistor STD and the source side select transistor STS may be simply referred to as select transistors (STD, STS).

The memory cell MC is a field effect type transistor including a semiconductor layer that functions as a channel region, a gate insulating film including a charge storage film, and a gate electrode. A threshold voltage of the memory cell MC changes according to a charge amount in the charge storage film. The memory cell MC stores 1-bit or multi-bit data. A word line WL is connected to each gate electrode of the plurality of memory cells MC corresponding to one memory string MS. Each of the word lines WL is commonly connected to all the memory strings MS in one memory block BLK.

The select transistors (STD, STS) are field effect type transistors each including a semiconductor layer that functions as a channel region, a gate insulating film, and a gate electrode. Select gate lines (SGD, SGS) are connected to gate electrodes of the select transistors (STD, STS), respectively. The drain selection line SGD is provided corresponding to the string unit SU and is commonly connected to all the memory strings MS in one string unit SU. The source selection line SGS is commonly connected to all the memory strings MS in one memory block BLK.

As shown in FIG. 4, the peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC also includes an input and output control circuit I/O and a logical circuit CTR.

The voltage generation circuit VG includes a plurality of operation voltage output terminals 31, as shown in FIG. 5, for example. The voltage generation circuit VG includes, for example, a step-down circuit such as a regulator and a step-up circuit such as a charge pump circuit. The step-down circuit and step-up circuit are respectively connected to terminals (FIG. 4) to which a power supply voltage $V_{cc}$ and a ground voltage $V_{ss}$ are supplied. The terminals are implemented by the pad electrodes P described with reference to FIGS. 2 and 3, for example. For example, the voltage generation circuit VG generates a plurality of operation voltages applied to the bit lines BL, the source lines SL, the word lines WL, and the select gate lines (SGD, SGS) during a read operation, a write operation, and an erase operation for the memory cell array MCA according to a control signal from the sequencer SQC, and simultaneously outputs the operation voltages to the plurality of operation voltage output terminals 31. The operation voltages output from the operation voltage output terminals 31 are appropriately adjusted according to the control signal from the sequencer SQC.

The voltage generation circuit VG generates a read voltage and a read pass voltage as operation voltages during the read operation. The read voltage is a voltage used to determine the data stored in a selected memory cell MC. When the read voltage is applied to the word line WL, a part of the plurality of memory cells MC connected to the word line WL are in an ON state, and the rest of the plurality of memory cells MC are in an OFF state. The read pass voltage is a voltage for turning ON the memory cells MC. Therefore, the read pass voltage is higher than the read voltage and a verify voltage described below. When the read pass voltage is applied to the word line WL, all of the plurality of memory cells MC connected to the word line WL are in the ON state.

The voltage generation circuit VG generates a write pass voltage and a program voltage as operation voltages during the write operation. The write pass voltage is a voltage for turning ON the memory cells MC and is larger than the read voltage. When the write pass voltage is applied to the word line WL, all of the plurality of memory cells MC connected to the word line WL are in the ON state. The program voltage is a voltage for storing charges in charge storage films of the memory cells MC, and is larger than the write pass voltage. When the program voltage is applied to the word line WL, electrons are stored in a part of the charge storage films of the plurality of memory cells MC, which increases a threshold voltage of the memory cells MC.

The voltage generation circuit VG generates a verify voltage and a read pass voltage as operation voltages during the write operation. The verify voltage is a voltage used to determine whether or not the threshold voltage of the selected memory cell MC is sufficiently increased. When the verify voltage is applied to the word line WL, among the plurality of memory cells MC connected to the word line WL, the word line whose threshold voltage is not sufficiently increased is in the ON state, and the word line whose threshold voltage is sufficiently increased is in the OFF state.

The row decoder RD (FIG. 4) includes, for example, as shown in FIG. 5, an address decoder 22 that decodes address data ADD, a block selection circuit 23 and a voltage selection circuit 24 that transfer an operation voltage to the memory cell array MCA according to an output signal of the address decoder 22.

The address decoder 22 includes a plurality of block selection lines BLKSEL and a plurality of voltage selection lines 33. The address decoder 22, for example, sequentially refers to a row address RA of the address register ADR (FIG. 4) according to a control signal from the sequencer SQC, decodes the row address RA, turns ON a predetermined block select transistor 35 and a voltage select transistor 37 corresponding to the row address RA, and turns OFF the rest of the block select transistors 35 and the voltage select transistors 37. For example, a voltage of the predetermined block selection line BLKSEL and the voltage selection line 33 is set to an "H" state, and the rest of voltages are set to an "L" state. When a P-channel transistor is used instead of an N-channel transistor, a reverse voltage is applied to these wirings.

In the shown example, the address decoder 22 is provided with one block selection line BLKSEL for each memory block MB. However, this configuration or arrangement may be changed as appropriate. For example, one block selection line BLKSEL may be provided for two or more memory blocks MB.

The block selection circuit 23 includes a plurality of block selection units 34 corresponding to the memory blocks MB. Each of the plurality of block selection units 34 includes a plurality of block select transistors 35 corresponding to the word lines WL and the select gate lines (SGD, SGS). The block select transistor 35 is, for example, a field effect type breakdown voltage transistor. Each of drain electrodes of the block select transistors 35 is electrically connected to a corresponding one of the word lines WL or the select gate lines (SGD, SGS). Each of source electrodes is electrically connected to a corresponding one of the operation voltage output terminals 31 via the wirings CG and the voltage selection circuit 24. The gate electrodes are commonly connected to the corresponding block selection line BLKSEL.

In the shown example, the block selection circuit 23 is provided with one block select transistor 35 for each word line WL, and is provided with one block select transistor 35 for each select gate line (SGD, SGS). However, this configuration may be changed as appropriate. For example, two block select transistors 35 may be provided for each select gate line (SGD, SGS).

The voltage selection circuit 24 includes a plurality of voltage selection units 36 corresponding to the word lines WL and the select gate lines (SGD, SGS). Each of the plurality of voltage selection units 36 includes a plurality of voltage select transistors 37. The voltage select transistor 37 is, for example, a field effect type breakdown voltage transistor. Each of drain terminals of the voltage select transistors 37 is electrically connected to a corresponding one of the word lines WL or select gate lines (SGD, SGS) via the wirings CG and the block selection circuit 23. Each of the source terminals is electrically connected to a corresponding one of the operation voltage output terminals 31. Each of gate electrodes is connected to a corresponding one of the voltage selection lines 33.

The sense amplifier module SAM is connected to the plurality of bit lines BL. The sense amplifier module SAM includes a plurality of sense amplifier units SAU corresponding to the bit lines BL, as shown in FIG. 6, for example. The sense amplifier unit SAU includes a sense amplifier circuit SA connected to the bit line BL, a wiring lbus connected to the sense amplifier circuit SA, a plurality of latch circuits ADL, BDL, CDL, DDL connected to the sense amplifier circuit SA via the wiring lbus, and a switch transistor DSW connected between the wiring lbus and a wiring dbus.

The sense amplifier circuit SA includes, for example, a sense circuit that detects a current of the bit line BL, a latch circuit that latches data detected by the sense circuit, and a voltage transfer circuit that transfers different voltages to the bit line BL according to the data latched by the latch circuit.

The sense circuit includes, for example, a sense transistor. The sense transistor includes a gate electrode connected to the bit line BL, a drain electrode connected to the wiring lbus, and a source electrode connected to a ground terminal. The latch circuit is connected to, for example, the lbus. The voltage transfer circuit includes, for example, a first transistor that connects the bit line BL to a first voltage supply line and a second transistor that connects the bit line BL to a second voltage supply line. Gate electrodes of the first transistor and the second transistor are connected to the latch circuit.

The latch circuits ADL, BDL, CDL, DDL latch user data written in the memory cell MC in the write operation. The latch circuits ADL, BDL, CDL, DDL are used for various types of calculation processing and the like.

Each of the plurality of sense amplifier units SAU is connected to a cache memory CM (FIG. 4) via a data bus DBUS including a plurality of wirings dbus. The cache memory CM includes a plurality of latch circuits corresponding to the sense amplifier unit SAU. The cache memory CM latches the user data written in the memory cell MC in the write operation or the user data read from the memory cell MC in the read operation.

A decode circuit and a switch circuit, which are not shown, are connected to the cache memory CM. The decode circuit decodes a column address CA stored in the address register ADR. The switch circuit brings the latch circuit corresponding to the column address CA into conduction with a bus DB according to an output signal of the decode circuit.

The sequencer SQC sequentially decodes command data CMD stored in the command register CMR, and outputs internal control signals to the row decoder RD, the sense amplifier module SAM, and the voltage generation circuit VG. The sequencer SQC appropriately outputs status data indicating own state of the sequencer SQC to the status register STR. The sequencer SQC generates a ready/busy signal and outputs the ready/busy signal to a terminal RY/BY. The terminal RY/BY is implemented by, for example, the pad electrodes P described with reference to FIGS. 2 and 3.

The input and output control circuit I/O includes data input and output terminals I/O0 to I/O7, an input circuit such as a comparator connected to the data input and output terminals I/O0 to I/O7, and an output circuit such as an OCD circuit. The input and output circuit I/O includes a shift register connected to the input circuit and the output circuit, and a buffer circuit. The data input and output terminals I/O0 to I/O7 are implemented by, for example, the pad electrodes P described with reference to FIGS. 2 and 3. Data input via the data input and output terminals I/O0 to I/O7 is output from the buffer circuit to the cache memory CM, the address register ADR, or the command register CMR according to the internal control signal from the logical circuit CTR. Data output from the data input and output terminals I/O0 to I/O7 is input from the cache memory CM or the status register STR to the buffer circuit according to the internal control signal from the logical circuit CTR.

The logical circuit CTR receives an external control signal from the control die CD via external control terminals /CEn, CLE, ALE, /WE, and/RE, and outputs the internal control signal to the input and output control circuit I/O accordingly. The external control terminals /CEn, CLE, ALE, /WE, and/RE are implemented by, for example, the pad electrodes P described with reference to FIGS. 2 and 3.

Figure 7:
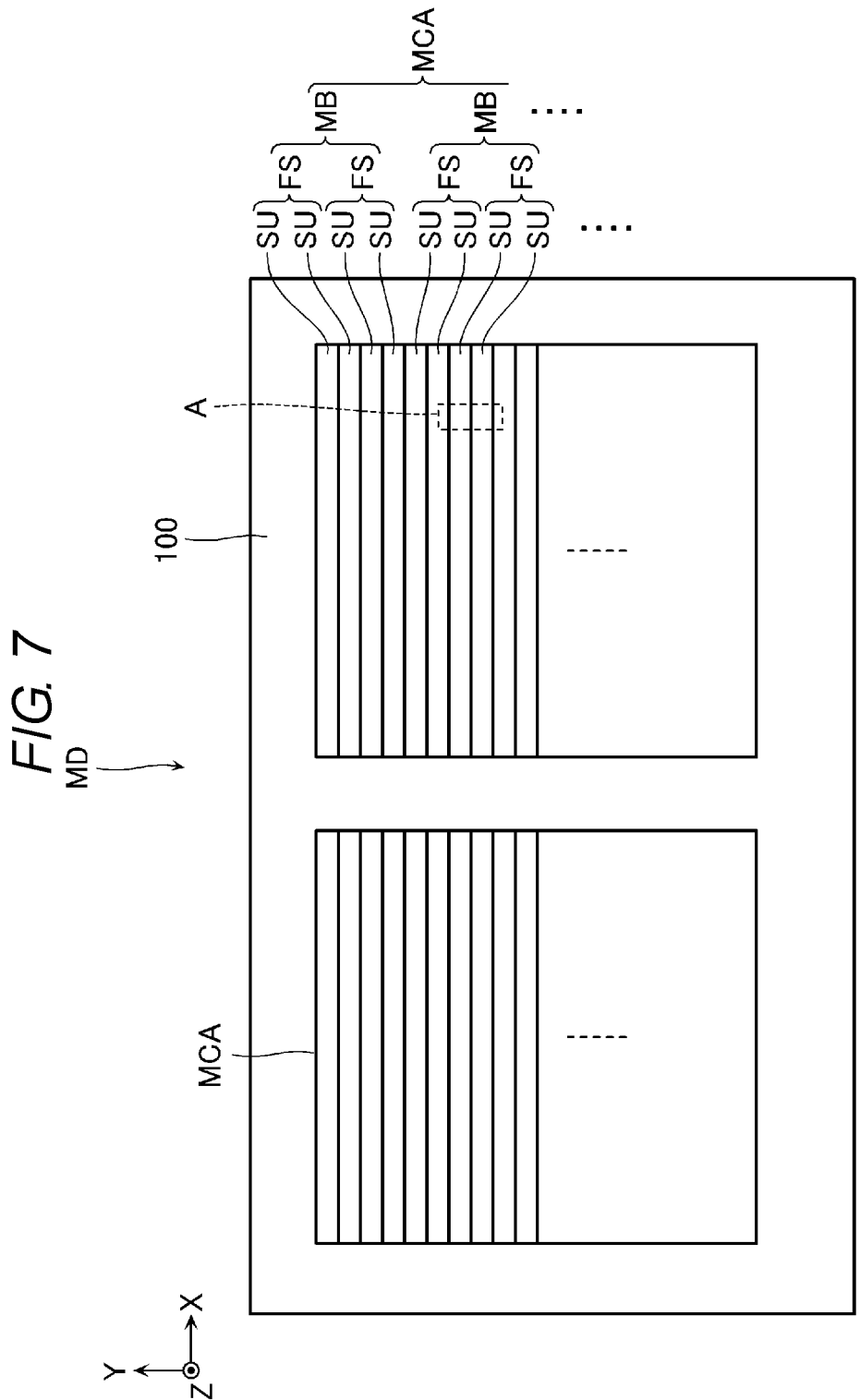
FIG. 7 is a schematic plan view of the memory die MD.

FIG. 7 is a schematic plan view of the memory die MD. As shown in FIG. 7, the memory die MD includes a semiconductor substrate 100. In the shown example, two memory cell arrays MCA arranged in the X direction are provided or disposed in the semiconductor substrate 100. The memory cell array MCA includes a plurality of memory blocks MB arranged in the Y direction. The memory block MB includes two finger structures FS arranged in the Y direction. The finger structure FS includes two string units SU arranged in the Y direction.

Figure 8:
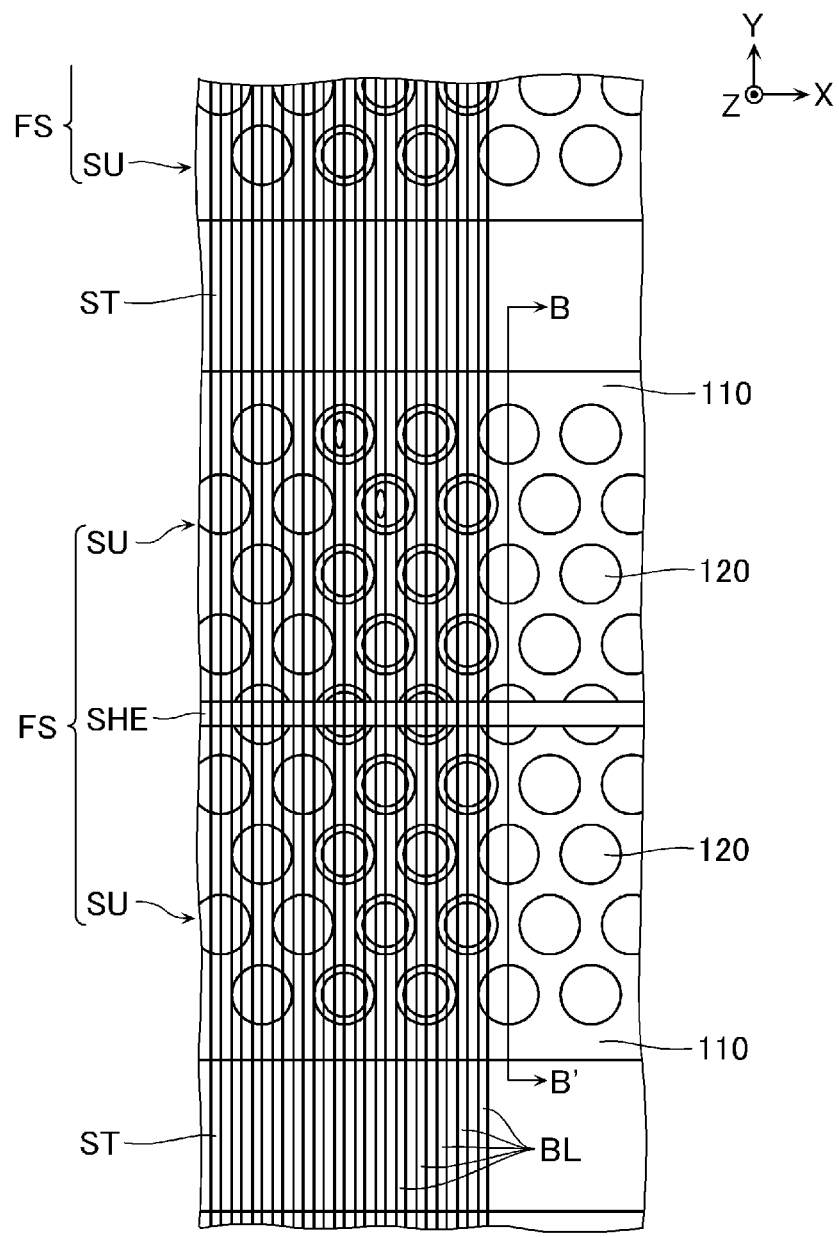
FIG. 8 is a schematic enlarged view of a part indicated by A in FIG. 7.

FIG. 8 is a schematic enlarged view of a part indicated by A in FIG. 7. As shown in FIG. 8, a block structure insulating layer ST extending in the X direction is provided between the two finger structures FS arranged in the Y direction. The finger structure FS includes a conductive layer 110 extending in the X direction and a plurality of semiconductor layers 120 arranged in a predetermined pattern in the X direction and the Y direction. A sub block insulating layer SHE extending in the X direction is provided between the two string units SU arranged in the Y direction. FIG. 8 shows a plurality of bit lines BL arranged in the X direction and extending in the Y direction. Each of the plurality of bit lines BL is connected to a corresponding semiconductor layer 120 provided in each string unit SU.

Figure 9:
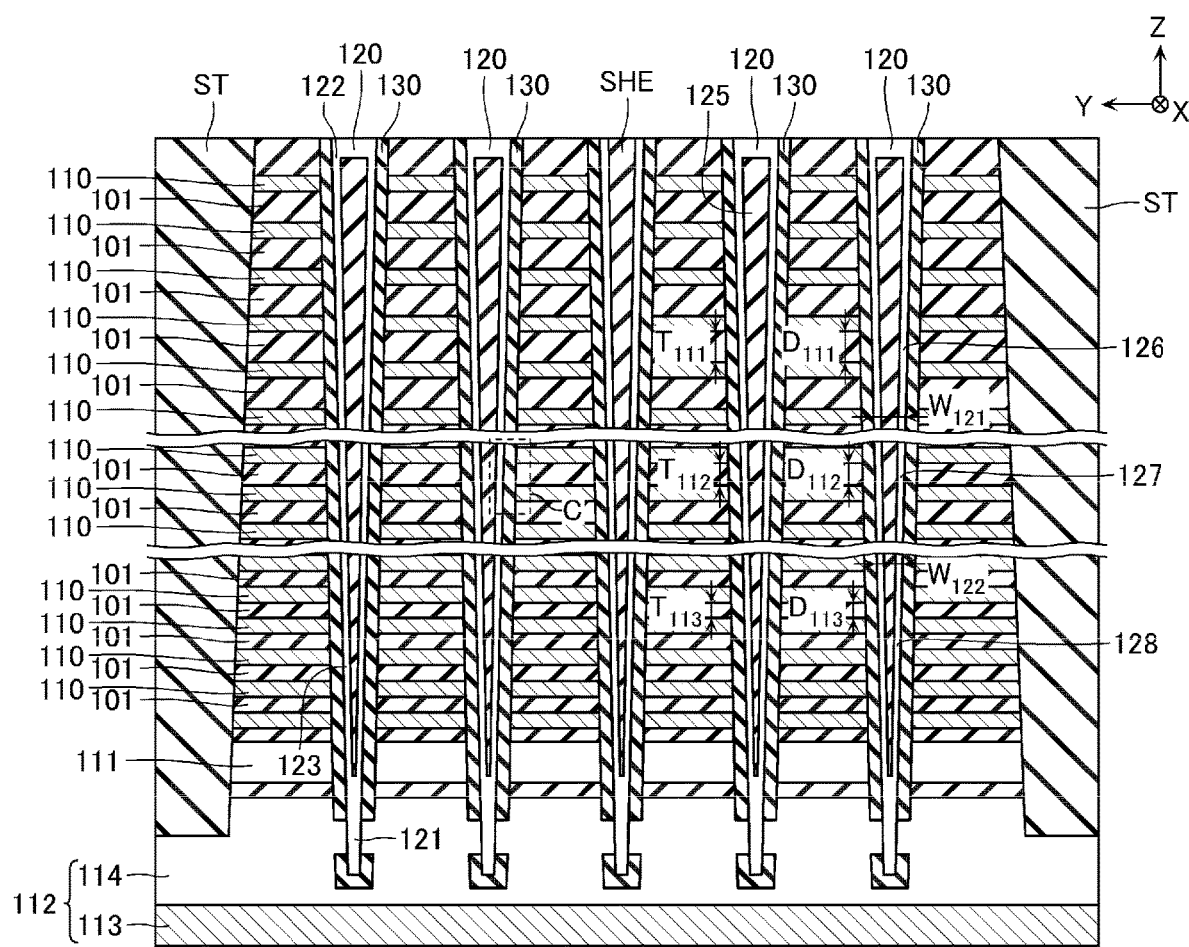
FIG. 9 is a schematic cross-sectional view of a structure shown in FIG. 8 taken along a line B-B' and viewed in a direction of an arrow.
Figure 10:
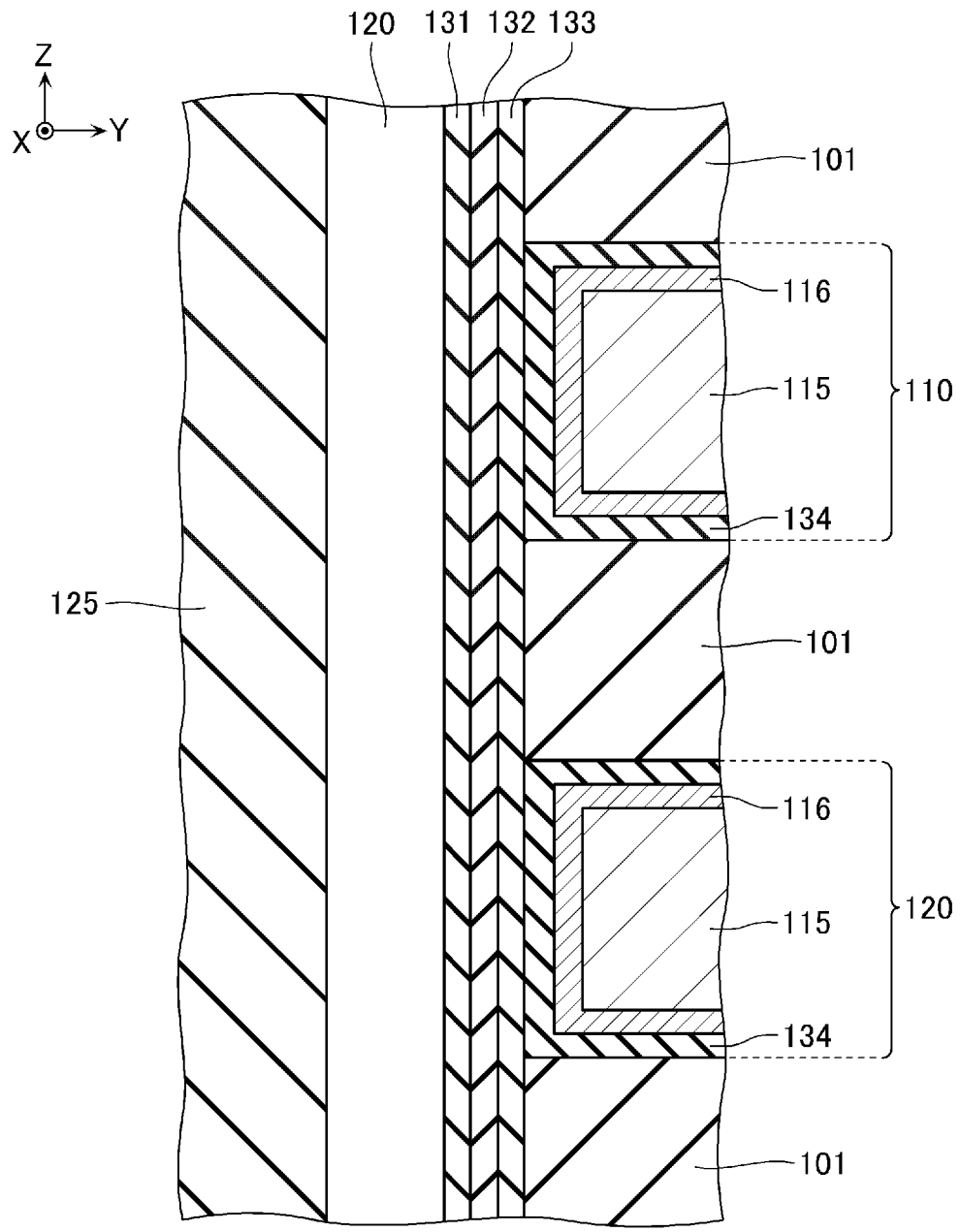
FIG. 10 is a schematic enlarged view of a part indicated by C in FIG. 9.

FIG. 9 is a schematic cross-sectional view of a structure shown in FIG. 8 taken along a line B-B' and viewed in a direction of an arrow. FIG. 10 is a schematic enlarged view of a part indicated by C in FIG. 9.

As shown in FIG. 9, the string unit SU includes a plurality of conductive layers 110 arranged in the Z direction, a plurality of semiconductor layers 120 extending in the Z direction, and a plurality of gate insulating films 130 each provided between a corresponding one of the plurality of conductive layers 110 and a corresponding one of the plurality of semiconductor layers 120.

The conductive layer 110 functions as a gate electrode such as a memory cell MC, a word line WL, and the like. The conductive layer 110 is a substantially plate-shaped conductive layer extending in the X direction. The conductive layer 110 may include, for example, as shown in FIG. 10, a stacked film of a barrier conductive film 116 formed of titanium nitride (TiN) or the like and a metal film 115 formed of tungsten (W) or the like. The conductive layer 110 may include, for example, polycrystalline silicon containing impurities such as phosphorus (P) or boron (B). Insulating layers 101 formed of silicon oxide ($SiO_2$), for example, are provided among the plurality of conductive layers 110 arranged in the Z direction.

As shown in FIG. 9, a conductive layer 111 is provided below the conductive layer 110. The conductive layer 111 functions as a gate electrode of the source side select transistor STS and a source selection line SGS. The conductive layer 111 may include, for example, polycrystalline silicon containing impurities such as phosphorus (P). The insulating layer 101 formed of silicon oxide ($SiO_2$) or the like is provided between the conductive layer 111 and the conductive layer 110.

A conductive layer 112 is provided below the conductive layer 111. The conductive layer 112 functions as a source line SL. The conductive layer 112 may include, for example, a conductive layer 113 containing a metal such as tungsten silicide (WSi), and a conductive layer 114 formed of, for example, polycrystalline silicon containing N-type impurities such as phosphorus (P). The insulating layer 101 such as silicon oxide ($SiO_2$) is provided between the conductive layer 112 and the conductive layer 111.

The semiconductor layer 120 functions as a channel region of the plurality of memory cells MC and the select transistors (STD, STS) provided in one memory string MS (FIG. 1). The semiconductor layer 120 is, for example, a semiconductor layer formed of polycrystalline silicon (Si) or the like. The semiconductor layer 120 has, for example, a substantially bottomed cylindrical shape, and is provided with an insulating layer 125 formed of silicon oxide or the like in a center part of the semiconductor layer 120. An outer peripheral surface of each of the semiconductor layers 120 is surrounded by a corresponding one of the conductive layers 110.

Impurity regions 121 and 122 containing N-type impurities such as phosphorus (P) are provided at a lower end portion and an upper end portion of the semiconductor layer 120. A region 123 not containing the N-type impurities such as phosphorus (P) is provided between the impurity regions 121 and 122. The impurity region 121 is connected to the conductive layer 114 and faces the conductive layer 111. The impurity region 122 is connected to the bit line BL (FIG. 8) via a contact that is not shown. The region 123 faces the conductive layer 111 and all the conductive layers 110 arranged in the Z direction. A part of the region 123 that faces the conductive layer 110 operating as the drain selection line SGD functions as a channel region of the drain side select transistor STD. A part of the region 123 that faces the conductive layer 110 operating as the word line WL functions as a channel region of the memory cell MC. A part of the region 123 that faces the conductive layer 110 operating as the source selection line SGS and a part of the region 123 that faces the conductive layer 111 function as a channel region of the source side select transistor STS.

The gate insulating film 130 has a substantially bottomed cylindrical shape covering the outer peripheral surface and the lower end of the semiconductor layer 120. However, the gate insulating film 130 is not provided at a connection part between the semiconductor layer 120 and the conductive layer 114.

As shown in FIG. 10, the gate insulating film 130 includes, for example, a tunnel insulating film 131, a charge storage film 132, a block insulating film 133, and a block insulating film 134 that are stacked between the semiconductor layer 120 and the conductive layer 110. The tunnel insulating film 131 and the block insulating film 133 are, for example, insulating films formed of silicon oxide ($SiO_2$), for example. The charge storage film 132 is a film that is capable of storing charges and is formed of, for example, silicon nitride ($Si_3N_4$) or the like. The block insulating film 134 is, for example, an insulating film containing a metal oxide such as alumina ($Al_2O_3$). The tunnel insulating film 131, the charge storage film 132, and the block insulating film 133 have a substantially cylindrical shape, and extend along the outer peripheral surface of the semiconductor layer 120 in the Z direction. The block insulating film 134 is formed, for example, along an upper surface, a lower surface, and a side surface of the conductive layer 110.

FIG. 10 shows an example in which the gate insulating film 130 includes the charge storage film 132 formed of silicon nitride or the like. However, the gate insulating film 130 may include, for example, a floating gate formed of, for example, polycrystalline silicon containing N-type or P-type impurities.

Next, the semiconductor storage device according to at least one embodiment will be described in more detail with reference to FIG. 9.

As shown in FIG. 9, the semiconductor layer 120 according to at least one embodiment has a smaller outer diameter in a lower part and a larger outer diameter in an upper part. For example, the region 123 of the semiconductor layer 120 includes a small region 126, a small region 127 located below the small region 126, and a small region 128 located below the small region 127. An outer diameter of the semiconductor layer 120 in the small region 126 is larger than a predetermined width $W_{121}$. The outer diameter of the semiconductor layer 120 in the small region 127 is smaller than the predetermined width $W_{121}$ and larger than a predetermined width $W_{122}$. The outer diameter of the semiconductor layer 120 in the small region 128 is smaller than the predetermined width $W_{122}$.

As shown in FIG. 9, the conductive layers 110 facing the small region 126 of the semiconductor layer 120 are arranged in the Z direction at an interval $D_{111}$. The conductive layers 110 facing the small region 127 of the semiconductor layer 120 are arranged in the Z direction at an interval $D_{112}$ smaller than the interval $D_{111}$. The conductive layers 110 facing the small region 128 of the semiconductor layer 120 are arranged in the Z direction at an interval $D_{113}$ smaller than the interval $D_{112}$.

As shown in FIG. 9, the insulating layer 101 provided between the conductive layers 110 facing the small region 126 of the semiconductor layer 120 has a thickness $T_{111}$ in the Z direction. The insulating layer 101 provided between the conductive layers 110 facing the small region 127 of the semiconductor layer 120 has a thickness $T_{112}$ smaller than the thickness $T_{111}$ in the Z direction. The insulating layer 101 provided between the conductive layers 110 facing the small region 128 of the semiconductor layer 120 has a thickness $T_{113}$ smaller than the thickness $T_{112}$ in the Z direction.

[Effect]

As shown in FIG. 8, a plurality of through via holes are provided in the conductive layer 110 according to the present embodiment, and the semiconductor layers 120 are provided inside the through via holes. As shown in FIG. 9, the semiconductor layer 120 according to at least one embodiment has the smaller outer diameter in the lower part and the larger outer diameter in the upper part. Therefore, the conductive layer 110 located below is formed with smaller through via holes, and the conductive layer 110 located above is formed with larger through via holes. In such an embodiment, the conductive layer 110 located below has a smaller wiring resistance, and the conductive layer 110 located above has a larger wiring resistance. In such an embodiment, when the conductive layer 110 is arranged at equal intervals in the Z direction, it is considered that a transfer speed of the voltage becomes larger as the conductive layer 110 is located below, and the transfer speed of the voltage becomes smaller as the conductive layer 110 is located above.

As described above, in at least one embodiment, the conductive layers 110 provided relatively above are arranged in the Z direction at the relatively large interval $D_{111}$. Accordingly, a capacitance between the conductive layers 110 can be reduced, and the transfer speed of the voltage can be increased. In at least one embodiment, the conductive layers 110 provided relatively below are arranged in the Z direction at the relatively small interval $D_{113}$. Accordingly, it is possible to achieve high integration of the semiconductor storage device in the Z direction while uniforming the transfer speed of the voltage among the plurality of conductive layers 110 stacked in the Z direction.

Second Embodiment

Next, a semiconductor storage device according to a second embodiment will be described with reference to FIG. 11. The semiconductor storage device according to the second embodiment is basically the same as the semiconductor storage device according to the first embodiment. However, the semiconductor storage device according to the second embodiment includes conductive layers 210 instead of the conductive layers 110.

The conductive layer 210 is basically the same as the conductive layer 110 according to the first embodiment. However, the conductive layer 210 facing the small region 126 of the semiconductor layer 120 has a thickness $T_{211}$ in the Z direction. The conductive layer 210 facing the small region 127 of the semiconductor layer 120 has a thickness $T_{212}$ smaller than the thickness $T_{211}$ in the Z direction. The conductive layer 210 facing the small region 128 of the semiconductor layer 120 has a thickness $T_{213}$ smaller than the thickness $T_{212}$ in the Z direction.

According to such a configuration, it is possible to reduce the wiring resistance of the conductive layer 210 provided relatively above and to increase the transfer speed of the voltage. In at least one embodiment, it is possible to reduce the thickness of the conductive layer 210 provided relatively below in the Z direction and to achieve high integration of the semiconductor storage device in the Z direction while providing a uniform the transfer speed of the voltage among the plurality of conductive layers 210 stacked in the Z direction.

Third Embodiment

Next, a semiconductor storage device according to a third embodiment will be described with reference to FIG. 12. The semiconductor storage device according to the third embodiment is basically the same as the semiconductor storage device according to the first embodiment. However, the semiconductor storage device according to the third embodiment includes conductive layers 310 instead of the conductive layers 110, insulating layers 301 instead of the insulating layers 101, and semiconductor layers 320 instead of the semiconductor layers 120.

The conductive layer 310, the insulating layer 301, and the semiconductor layer 320 are basically the same as the conductive layer 110, the insulating layer 101, and the semiconductor layer 120 according to the first embodiment.

However, the semiconductor layer 320 according to at least one embodiment has a smaller outer diameter in a part located near the lower end and a part located near the upper end, and a larger outer diameter in apart located therebetween. For example, a region 323 of the semiconductor layer 320 includes a small region 326, a small region 327 located below the small region 326, a small region 328 located below the small region 327, and a small region 329 located above the small region 326. An outer diameter of the semiconductor layer 320 in the small region 326 is larger than a predetermined width $W_{321}$. The outer diameter of the semiconductor layer 320 in the small region 327 is smaller than the predetermined width $W_{321}$ and larger than a predetermined width $W_{322}$. The outer diameter of the semiconductor layer 320 in the small region 328 is smaller than the predetermined width $W_{322}$. The outer diameter of the semiconductor layer 320 in the small region 329 is smaller than the predetermined width $W_{321}$ and larger than the predetermined width $W_{322}$.

Figure 12:
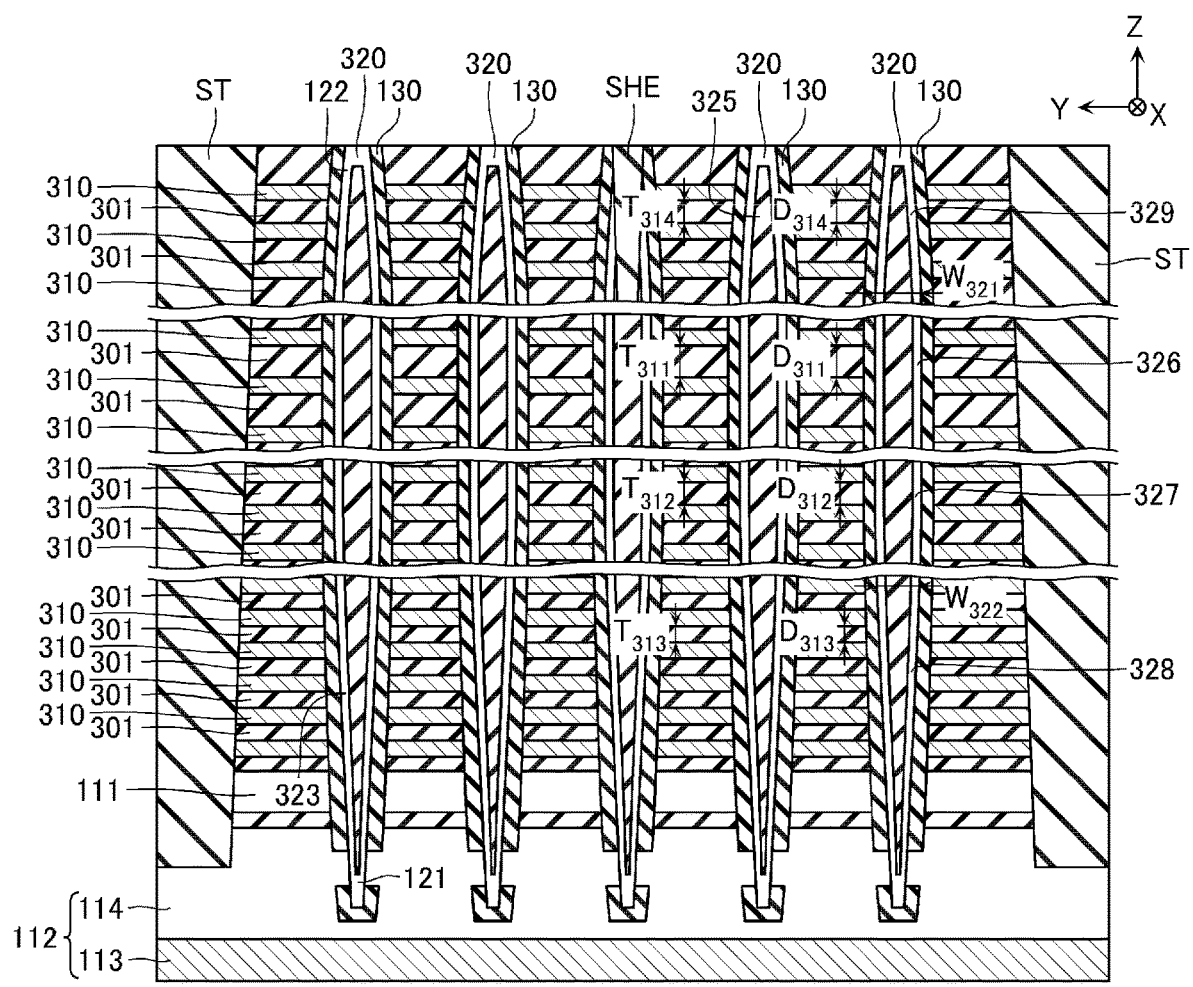
FIG. 12 is a schematic cross-sectional view of a semiconductor storage device according to a third embodiment.

As shown in FIG. 12, the conductive layers 310 facing the small region 326 of the semiconductor layer 320 are arranged in the Z direction at an interval $D_{311}$. The conductive layers 310 facing the small region 327 of the semiconductor layer 320 are arranged in the Z direction at an interval $D_{312}$ smaller than the interval $D_{311}$. The conductive layers 310 facing the small region 328 of the semiconductor layer 320 are arranged in the Z direction at an interval $D_{313}$ smaller than the interval $D_{312}$. The conductive layers 310 facing the small region 329 of the semiconductor layer 320 are arranged in the Z direction at an interval $D_{314}$ smaller than the interval $D_{311}$ and larger than the interval $D_{312}$.

As shown in FIG. 12, the insulating layer 301 provided between the conductive layers 310 facing the small region 326 of the semiconductor layer 320 has a thickness $T_{311}$ in the Z direction. The insulating layer 301 provided between the conductive layers 310 facing the small region 327 of the semiconductor layer 320 has a thickness $T_{312}$ smaller than the thickness $T_{311}$ in the Z direction. The insulating layer 301 provided between the conductive layers 310 facing the small region 328 of the semiconductor layer 320 has a thickness $T_{313}$ smaller than the thickness $T_{312}$ in the Z direction. The insulating layer 301 provided between the conductive layers 310 facing the small region 329 of the semiconductor layer 320 has a thickness $T_{314}$ smaller than the thickness $T_{311}$ and larger than the thickness $T_{312}$ in the Z direction.

Fourth Embodiment

Figure 13:
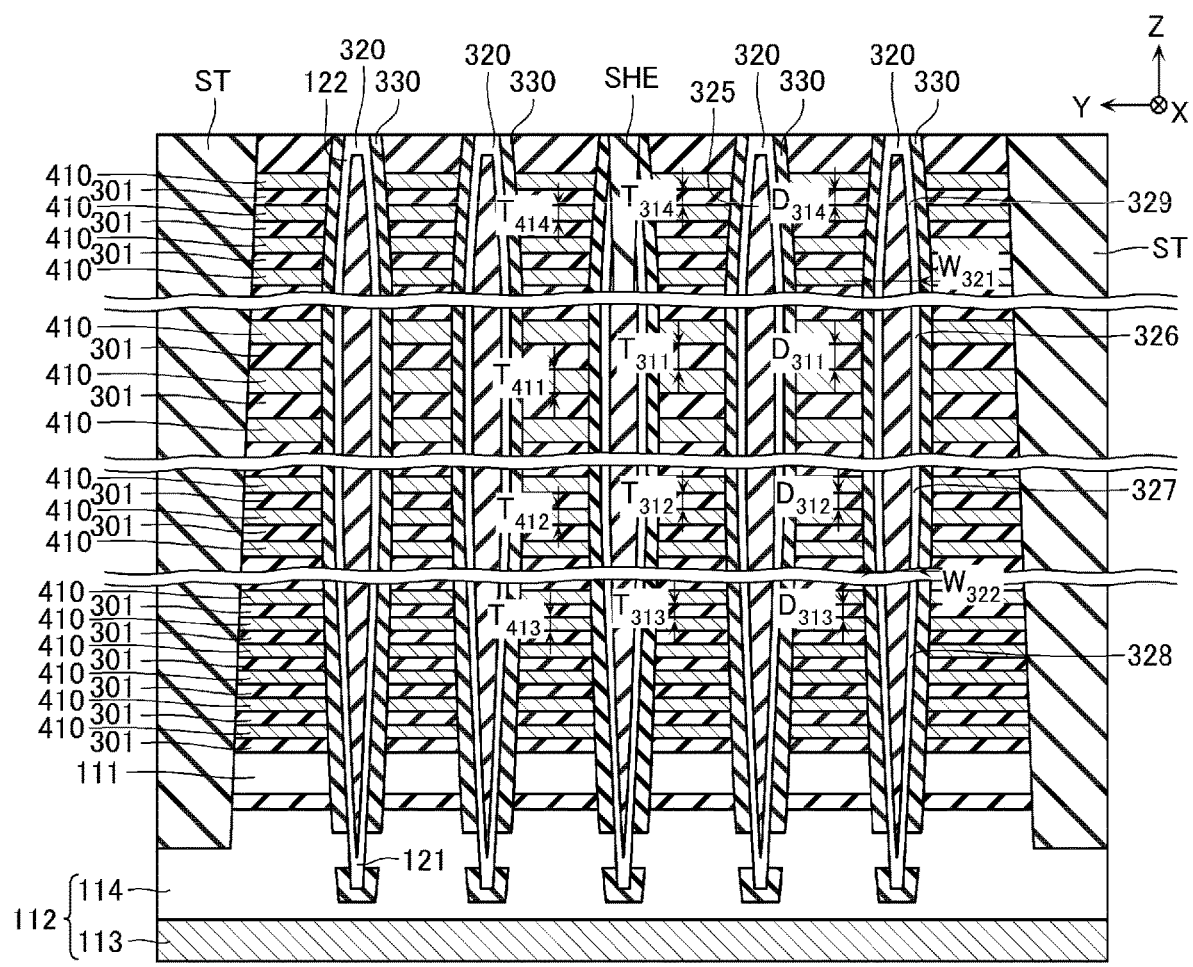
FIG. 13 is a schematic cross-sectional view of a semiconductor storage device according to a fourth embodiment.

Next, a semiconductor storage device according to a fourth embodiment will be described with reference to FIG. 13. The semiconductor storage device according to the fourth embodiment is basically the same as the semiconductor storage device according to the third embodiment. However, the semiconductor storage device according to the fourth embodiment includes conductive layers 410 instead of the conductive layers 310.

The conductive layer 410 is basically the same as the conductive layer 310 according to the third embodiment. However, the conductive layer 410 facing the small region 326 of the semiconductor layer 320 has a thickness $T_{411}$ in the Z direction. The conductive layer 410 facing the small region 327 of the semiconductor layer 320 has a thickness $T_{412}$ smaller than the thickness $T_{411}$ in the Z direction. The conductive layer 410 facing the small region 328 of the semiconductor layer 320 has a thickness $T_{413}$ smaller than the thickness $T_{412}$ in the Z direction. The conductive layer 410 facing the small region 329 of the semiconductor layer 320 has a thickness $T_{414}$ smaller than the thickness $T_{411}$ and larger than the thickness $T_{412}$ in the Z direction.

Fifth Embodiment

Next, a semiconductor storage device according to a fifth embodiment will be described with reference to FIG. 14. The semiconductor storage device according to the fifth embodiment is basically the same as the semiconductor storage device according to the first embodiment. However, the semiconductor storage device according to the fifth embodiment includes conductive layers 510 in addition to the conductive layers 110, insulating layers 501 in addition to the insulating layers 101, and semiconductor layers 520 instead of the semiconductor layers 120.

The conductive layer 510 and the insulating layer 501 are basically the same as the conductive layer 110 and the insulating layer 101. However, the conductive layer 510 and the insulating layer 501 are provided above the conductive layer 110 and the insulating layer 101.

The semiconductor layer 520 is basically the same as the semiconductor layer 120. However, the semiconductor layer 520 includes a region 521 located below, a region 522 located above, and a region 523 connected to an upper end of the region 521 and a lower end of the region 522.

An outer peripheral surface of each of the regions 521 is surrounded by the corresponding conductive layers 110, and faces the plurality of conductive layers 110. The impurity region 121 containing N-type impurities such as phosphorus (P) is provided at a lower end portion of the region 521. A region 524 not containing the N-type impurities such as phosphorus (P) is provided above the impurity region 121. A part of the region 524 that faces the conductive layer 110 operating as the word line WL functions as a channel region of the memory cell MC. A part of the region 524 that faces the conductive layer 110 operating as the source selection line SGS and a part of the region 524 that faces the conductive layer 111 function as a channel region of the source side select transistor STS.

An outer peripheral surface of each of the regions 522 is surrounded by the corresponding conductive layers 510, and faces the plurality of conductive layers 510. The impurity region 122 containing the N-type impurities such as phosphorus (P) is provided at an upper end portion of the region 522. A region 525 not containing the N-type impurities such as phosphorus (P) is provided below the impurity region 122. A part of the region 525 that faces the conductive layer 510 operating as the word line WL functions as a channel region of the memory cell MC. A part of the region 525 that faces the conductive layer 510 operating as the drain selection line SGD functions as a channel region of the drain side select transistor STD.

In the semiconductor layer 520 according to at least one embodiment, an outer diameter $W_{521}$ of the region 523 is larger than a maximum value of the outer diameters of the regions 521 and 522. The regions 521 and 522 have smaller outer diameters in parts located below and larger outer diameters in parts located above. For example, the region 524 of the semiconductor layer 520 includes a small region 526, a small region 527 located below the small region 526, and a small region 528 located below the small region 527. The outer diameter of the semiconductor layer 520 in the small region 526 is smaller than an outer diameter $W_{521}$ and larger than a predetermined width $W_{522}$. The outer diameter of the semiconductor layer 520 in the small region 527 is smaller than the predetermined width $W_{522}$ and larger than a predetermined width $W_{523}$. The outer diameter of the semiconductor layer 520 in the small region 528 is smaller than the predetermined width $W_{523}$. For example, the region 525 of the semiconductor layer 520 includes a small region 529, a small region 530 located below the small region 529, and a small region 531 located below the small region 530. The outer diameter of the semiconductor layer 520 in the small region 529 is smaller than the outer diameter $W_{521}$ and larger than a predetermined width $W_{524}$. The outer diameter of the semiconductor layer 520 in the small region 530 is smaller than the predetermined width $W_{524}$ and larger than a predetermined width $W_{525}$. The outer diameter of the semiconductor layer 520 in the small region 531 is smaller than the predetermined width $W_{525}$.

Figure 14:
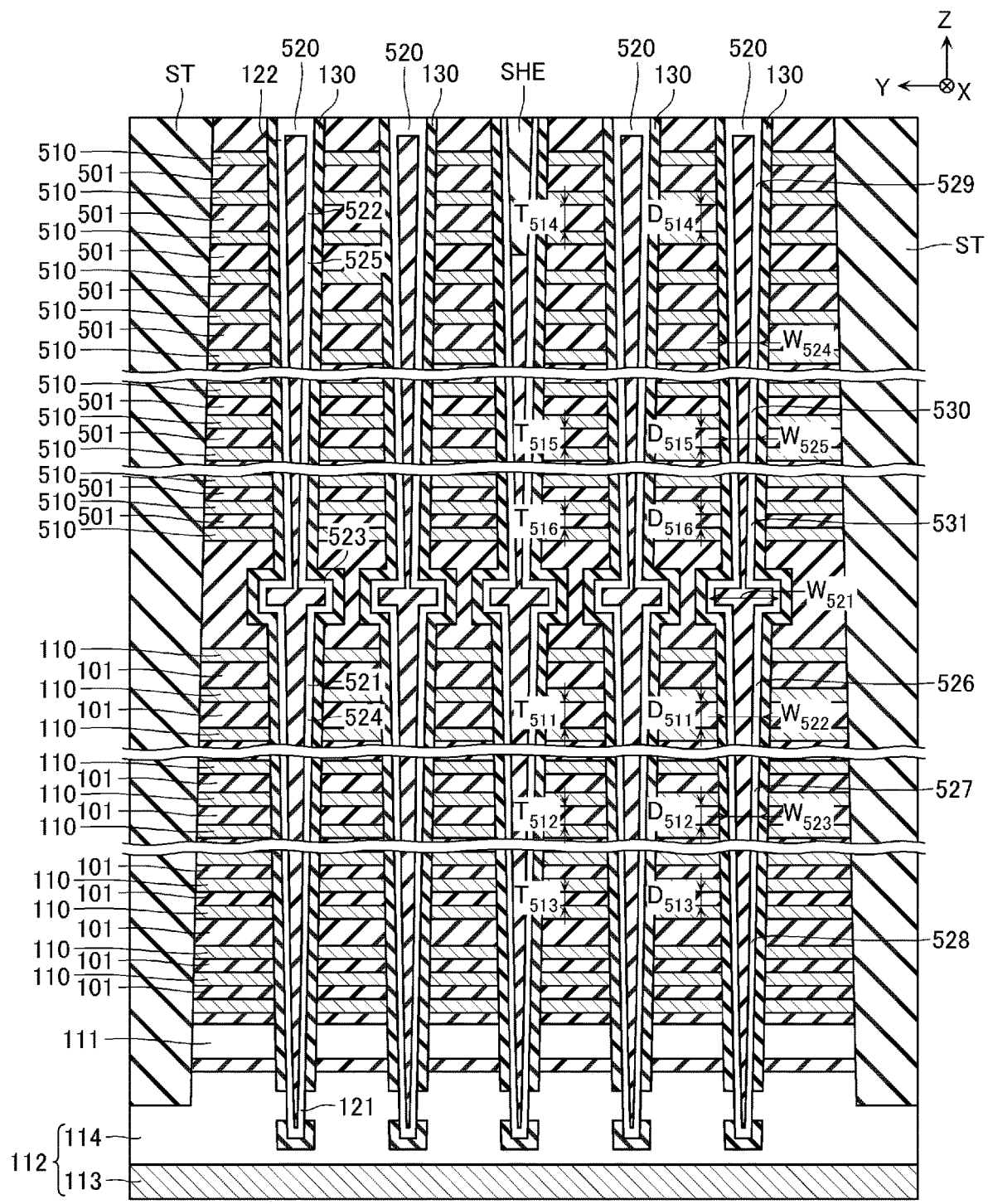
FIG. 14 is a schematic cross-sectional view of a semiconductor storage device according to a fifth embodiment.

As shown in FIG. 14, the conductive layers 110 facing the small region 526 of the semiconductor layer 520 are arranged in the Z direction at an interval $D_{511}$. The conductive layers 110 facing the small region 527 of the semiconductor layer 520 are arranged in the Z direction at an interval $D_{512}$ smaller than the interval $D_{511}$. The conductive layers 110 facing the small region 528 of the semiconductor layer 520 are arranged in the Z direction at an interval $D_{513}$ smaller than the interval $D_{512}$.

As shown in FIG. 14, the conductive layers 510 facing the small region 529 of the semiconductor layer 520 are arranged in the Z direction at an interval $D_{514}$. The conductive layers 510 facing the small region 530 of the semiconductor layer 520 are arranged in the Z direction at an interval $D_{515}$ smaller than the interval $D_{514}$. The conductive layers 510 facing the small region 531 of the semiconductor layer 520 are arranged in the Z direction at an interval $D_{516}$ smaller than the interval $D_{515}$.

The interval $D_{511}$ may be equal to the interval $D_{514}$. The interval $D_{512}$ may be equal to the interval $D_{515}$. The interval $D_{513}$ may be equal to the interval $D_{516}$.

As shown in FIG. 14, the insulating layer 101 provided between the conductive layers 110 facing the small region 526 of the semiconductor layer 520 has a thickness $T_{511}$ in the Z direction. The insulating layer 101 provided between the conductive layers 110 facing the small region 527 of the semiconductor layer 520 has a thickness $T_{512}$ smaller than the thickness $T_{511}$ in the Z direction. The insulating layer 101 provided between the conductive layers 110 facing the small region 528 of the semiconductor layer 520 has a thickness $T_{513}$ smaller than the thickness $T_{512}$ in the Z direction.

As shown in FIG. 14, the insulating layer 501 provided between the conductive layers 510 facing the small region 529 of the semiconductor layer 520 has a thickness $T_{514}$ in the Z direction. The insulating layer 501 provided between the conductive layers 510 facing the small region 530 of the semiconductor layer 520 has a thickness $T_{515}$ smaller than the thickness $T_{514}$ in the Z direction. The insulating layer 501 provided between the conductive layers 510 facing the small region 531 of the semiconductor layer 520 has a thickness $T_{516}$ smaller than the thickness $T_{515}$ in the Z direction.

The thickness $T_{511}$ may be equal to the thickness $T_{514}$. The thickness $T_{512}$ may be equal to the thickness $T_{515}$. The thickness $T_{513}$ may be equal to the thickness $T_{516}$.

In the example in FIG. 14, similarly to the semiconductor layer 120 according to the first embodiment, the regions 521 and 522 of the semiconductor layer 520 have smaller outer diameters in lower parts and larger outer diameters in upper parts. However, similarly to the semiconductor layer 320 according to the third embodiment, for example, the regions 521 and 522 may have the outer diameters smaller in the part located near the lower end and the part located near the upper end, and the outer diameter is larger in the part located therebetween.

The semiconductor storage device shown in FIG. 14 includes the conductive layers 110 and the insulating layers 101, and the conductive layers 510 and the insulating layers 501 that are configured in the same manner as the conductive layers 110 and the insulating layers 101. However, the semiconductor storage device shown in FIG. 14 may include, for example, the conductive layers 210 and the insulating layers 101, and conductive layers and insulating layers that are configured in the same manner as the conductive layers 210 and the insulating layers 101. For example, the conductive layers 410 and the insulating layers 101, and conductive layers and insulating layers that are configured in the same manner as the conductive layers 410 and the insulating layers 101 may be provided.

Sixth Embodiment

Figure 15:
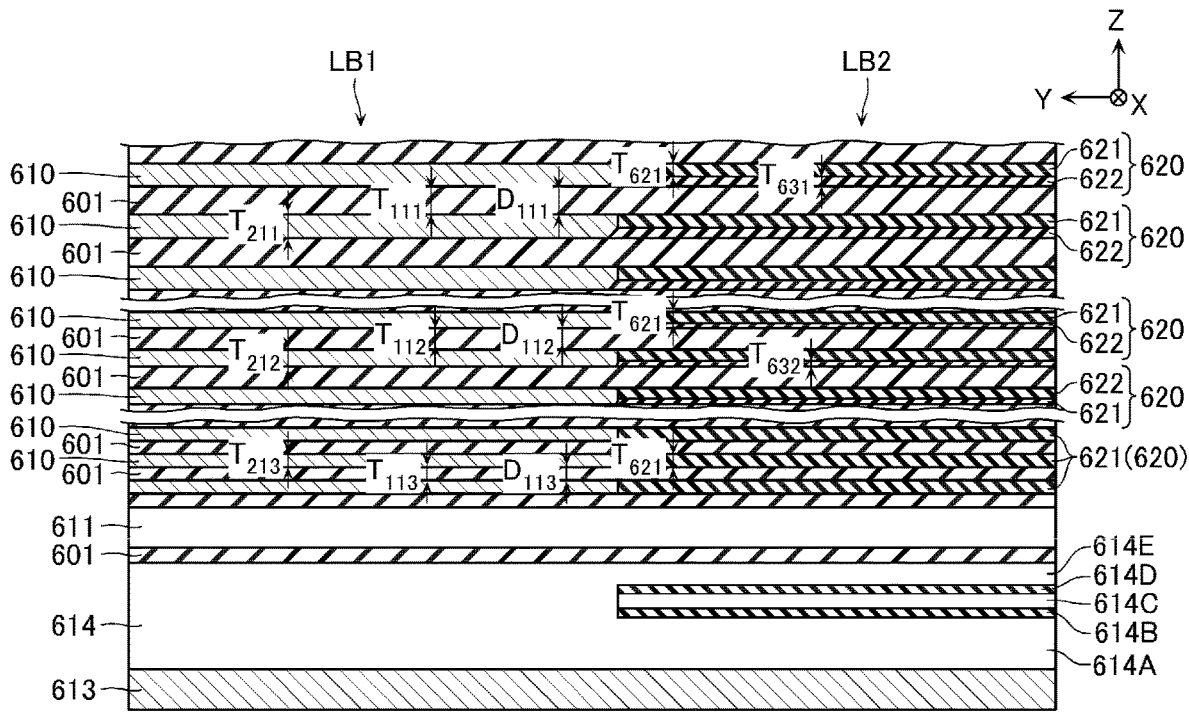
FIG. 15 is a schematic cross-sectional view of a semiconductor storage device according to a sixth embodiment.

Next, a semiconductor storage device according to a sixth embodiment will be described with reference to FIG. 15. The semiconductor storage device according to the sixth embodiment is basically the same as the semiconductor storage device according to the second embodiment. However, the semiconductor storage device according to the sixth embodiment has a structure as shown in FIG. 15. For example, the structure shown in FIG. 15 may be provided inside a region where the memory cell array MCA is provided, or may be provided outside the region where the memory cell array MCA is provided. Although a YZ cross section is shown in FIG. 15, the semiconductor storage device according to at least one embodiment may have an XZ cross section as shown in FIG. 15.

The structure shown in FIG. 15 includes a stacked body LB1 and a stacked body LB2.

The stacked body LB1 includes a conductive layer 613, a conductive layer 614, an insulating layers 601, and a conductive layer 611 that are arranged in order in the Z direction. The stacked body LB1 includes a plurality of conductive layers 610 arranged in the Z direction. The insulating layers 601 are provided among the plurality of conductive layers 610 arranged in the Z direction. The conductive layer 613, the conductive layer 614, the insulating layer 601, the conductive layer 611, and the conductive layer 610 are the same as the conductive layer 113, the conductive layer 114, the insulating layer 101, the conductive layer 111, and the conductive layer 110, respectively. The number of the conductive layers 610 and the insulating layers 601 that are arranged in the Z direction and the thicknesses of the conductive layers 610 and the insulating layers 601 in the Z direction are equal to the number of the conductive layers 210 and the insulating layers 101 that are arranged in the Z direction, and the thicknesses of the conductive layers 210 and the insulating layers 101 in the Z direction, respectively.

The stacked body LB2 includes the conductive layer 613, a conductive layer 614A, an insulating layer 614B, a semiconductor layer 614C, an insulating layer 614D, a conductive layer 614E, the insulating layer 601, and the conductive layer 611. The stacked body LB2 includes a plurality of insulating layers 620 arranged in the Z direction. The insulating layers 601 are provided among the plurality of insulating layers 620 arranged in the Z direction. The number of the insulating layers 620 and the insulating layers 601 that are arranged in the Z direction and the thicknesses of the insulating layers 620 and the insulating layers 601 in the Z direction are equal to the number of the conductive layers 210 and the insulating layers 101 that are arranged in the Z direction, and the thicknesses of the conductive layers 210 and the insulating layers 101 in the Z direction, respectively.

In the stacked bodies LB1 and LB2, the conductive layer 613, the conductive layer 611, and the plurality of insulating layers 601 are continuously and integrally formed. The conductive layer 614 is continuously and integrally formed with the conductive layers 614A and 614E. At least one of X direction side surfaces and Y direction side surfaces of the insulating layer 614B, the semiconductor layer 614C, and the insulating layer 614D is connected to the conductive layer 614. At least one of an X direction side surface and a Y direction side surface of the insulating layers 620 is connected to the conductive layer 610.

The insulating layer 620 includes, for example, an insulating film 621 formed of silicon nitride ($Si_3N_4$) or the like. At least a part of the plurality of insulating layers 620 includes an insulating film 622 formed of silicon nitride or the like. The insulating film 622 has at least one of a density larger than that of the insulating film 621, a content of hydrogen smaller than that of the insulating film 621, or an etching rate of phosphoric acid or the like smaller than that of the insulating film 621.

In the shown example, the insulating layer 620 having the thickness $T_{211}$ in the Z direction includes the insulating film 621 and the insulating film 622. The insulating film 621 has a thickness $T_{621}$ in the Z direction. The insulating film 622 has a thickness $T_{631}$ in the Z direction.

In the shown example, the insulating layer 620 having the thickness $T_{212}$ in the Z direction includes the insulating film 621 and the insulating film 622. The insulating film 621 has the thickness $T_{621}$ in the Z direction. The insulating film 622 has a thickness $T_{632}$ in the Z direction. The thickness $T_{632}$ is smaller than the thickness $T_{631}$.

In the shown example, the insulating layer 620 having the thickness $T_{213}$ in the Z direction includes the insulating film 621. The insulating film 621 has the thickness $T_{621}$ in the Z direction. In the shown example, the thickness $T_{621}$ is equal to the thickness $T_{213}$. That is, the insulating layer 620 does not include the insulating film 622.

Next, a manufacturing method of the semiconductor storage device according to the present embodiment will be described with reference to FIGS. 16 to 26. FIGS. 16 to 26 are schematic cross-sectional views showing the manufacturing method.

Figure 16:
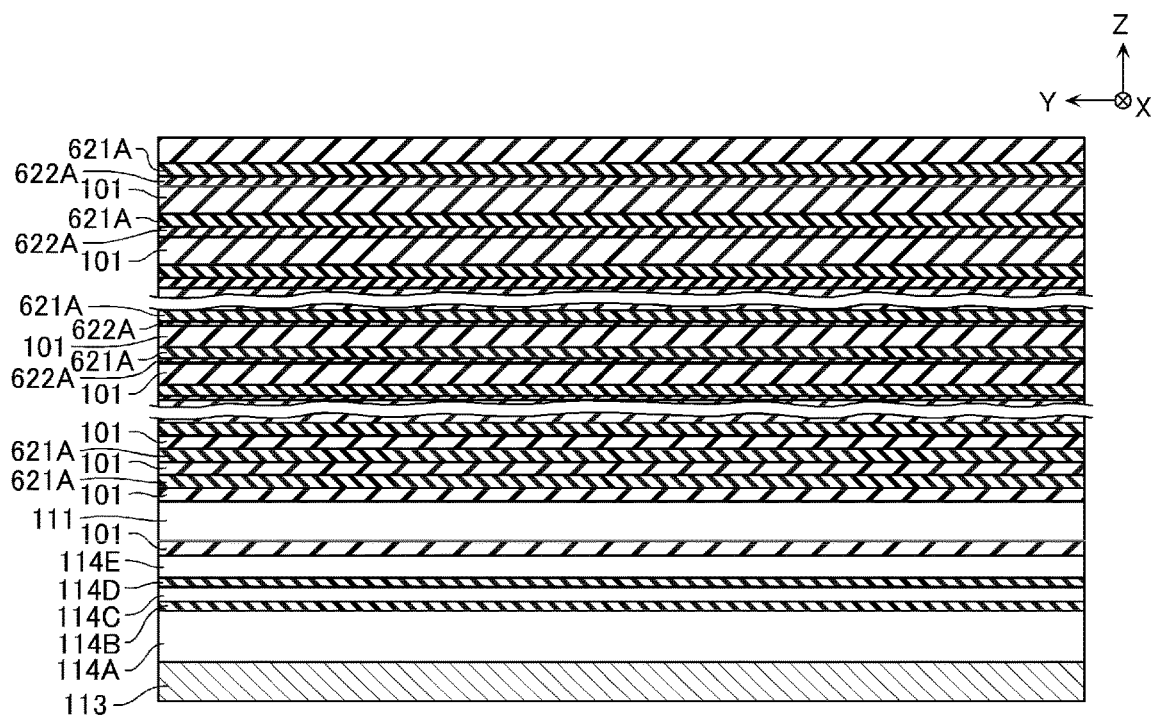
FIG. 16 is a schematic cross-sectional view showing a method for manufacturing the semiconductor storage device according to the sixth embodiment.

In the manufacturing method, for example, as shown in FIG. 16, the conductive layer 113, a semiconductor layer 114A formed of silicon or the like, a sacrificial layer 114B formed of silicon oxide or the like, a sacrificial layer 114C formed of silicon or the like, a sacrificial layer 114D formed of silicon oxide or the like, a semiconductor layer 114E formed of silicon or the like, the insulating layers 101, and the conductive layer 111 are formed. A plurality of insulating layers 101 and a plurality of sacrificial layers 621A are alternately formed. The insulating layer 601, sacrificial layers 622A, and the sacrificial layers 621A are sequentially formed a plurality of times. This step is performed using a method such as chemical vapor deposition (CVD).

The sacrificial layers 621A and 622A include, for example, silicon nitride ($Si_3N_4$). The sacrificial layer 622A has at least one of a density larger than that of the sacrificial layer 621A, a content of hydrogen smaller than that of the sacrificial layer 621A, and an etching rate of a chemical solution such as phosphoric acid smaller than that of the sacrificial layer 621A.

Figure 17:
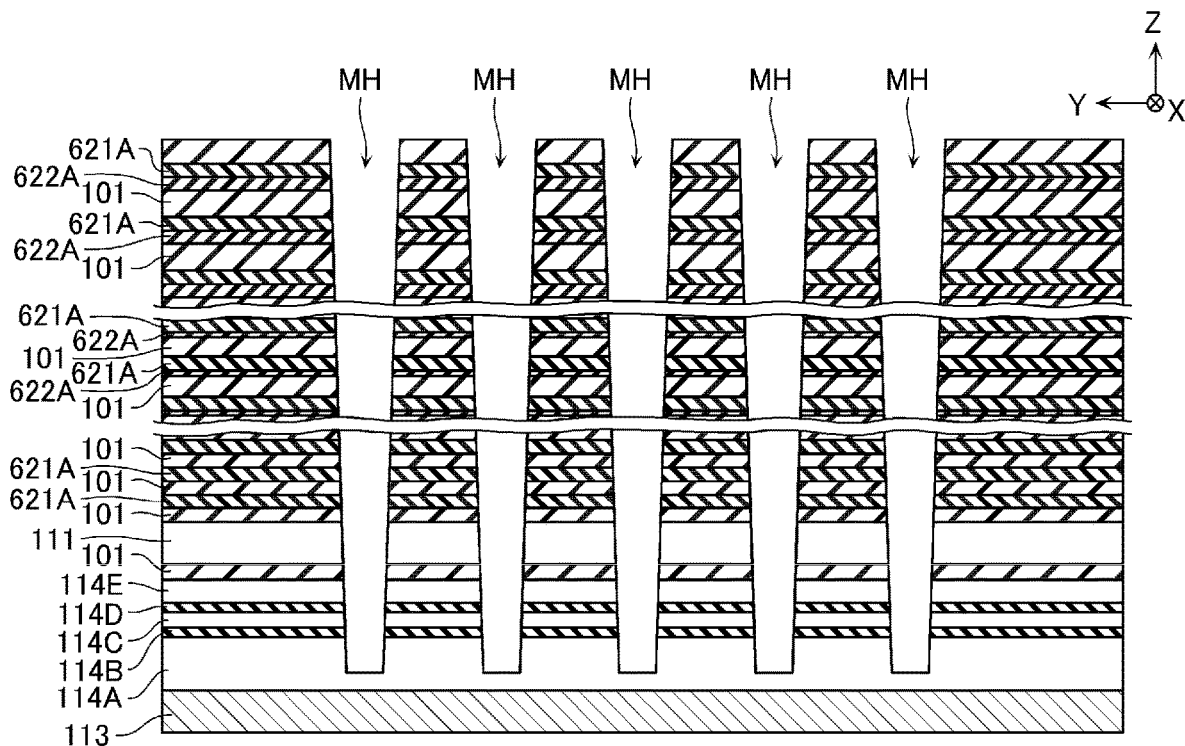
FIG. 17 is a schematic cross-sectional view showing the manufacturing method.

Next, as shown in FIG. 17, for example, openings MH extending in the Z direction are formed penetrating the plurality of insulating layers 101 and the plurality of sacrificial layers 621A and 622A, the conductive layer 111, the semiconductor layer 114E, the sacrificial layer 114D, the sacrificial layer 114C, and the sacrificial layer 114B. This step is performed using a method such as reactive ion etching (RIE).

Figure 18:
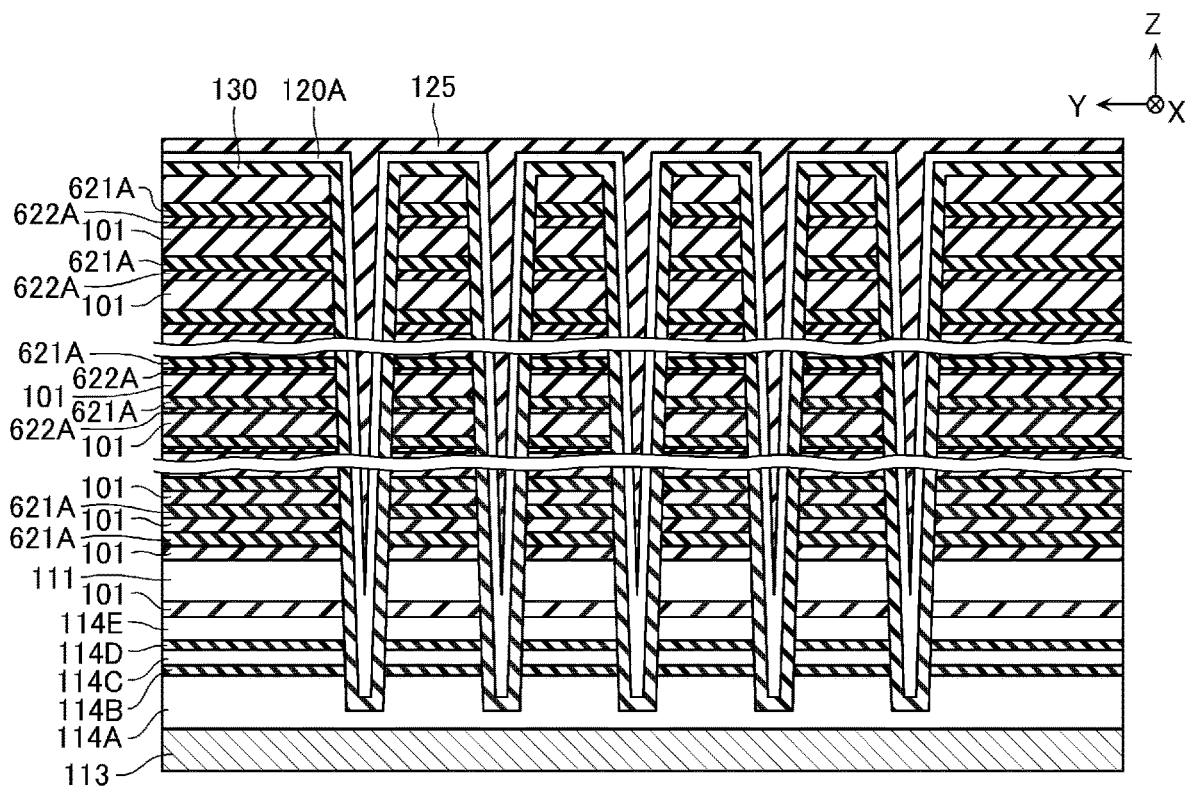
FIG. 18 is a schematic cross-sectional view showing the manufacturing method.

Next, as shown in FIG. 18, for example, the gate insulating film 130, the semiconductor layer 120A formed of silicon or the like, and the insulating layer 125 are formed inside the opening MH and on the upper surface of the insulating layer 101 located in an uppermost layer. This step is performed using the method such as CVD.

Figure 19:
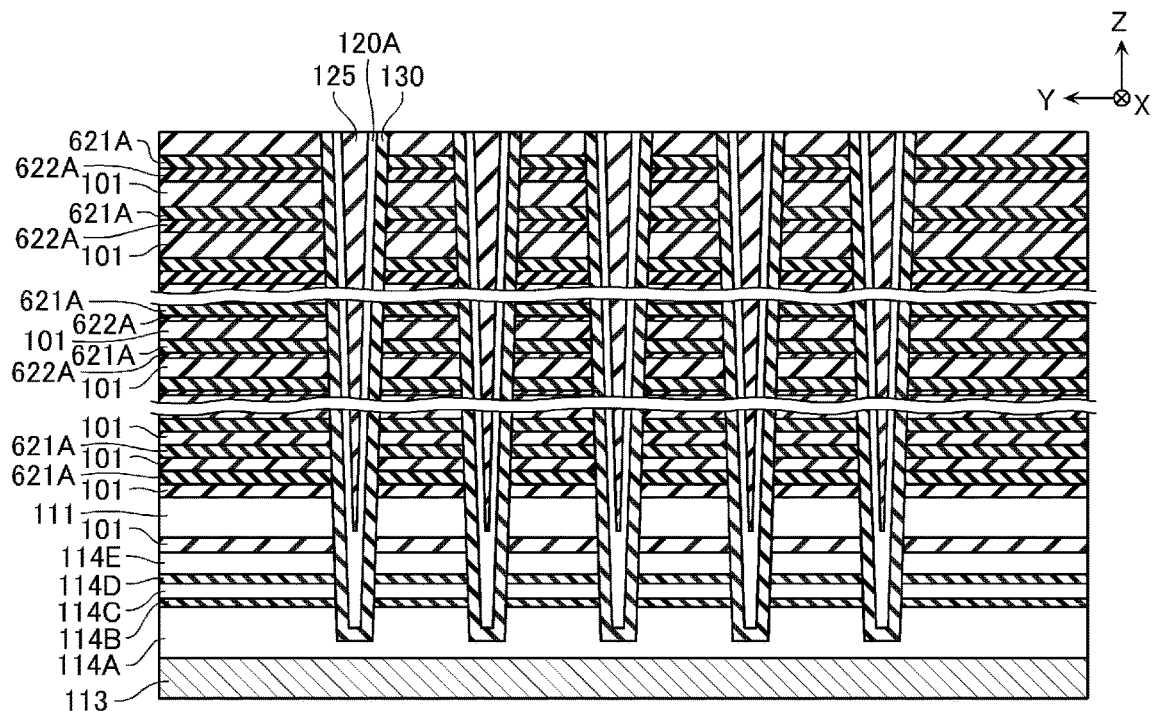
FIG. 19 is a schematic cross-sectional view showing the manufacturing method.

Next, for example, as shown in FIG. 19, among the gate insulating film 130, a semiconductor layer 120A formed of silicon or the like, and the insulating layer 125, apart provided on the upper surface of the insulating layer 101 located in the uppermost layer is removed. This step is performed using a method such as etch back using RIE.

Figure 20:
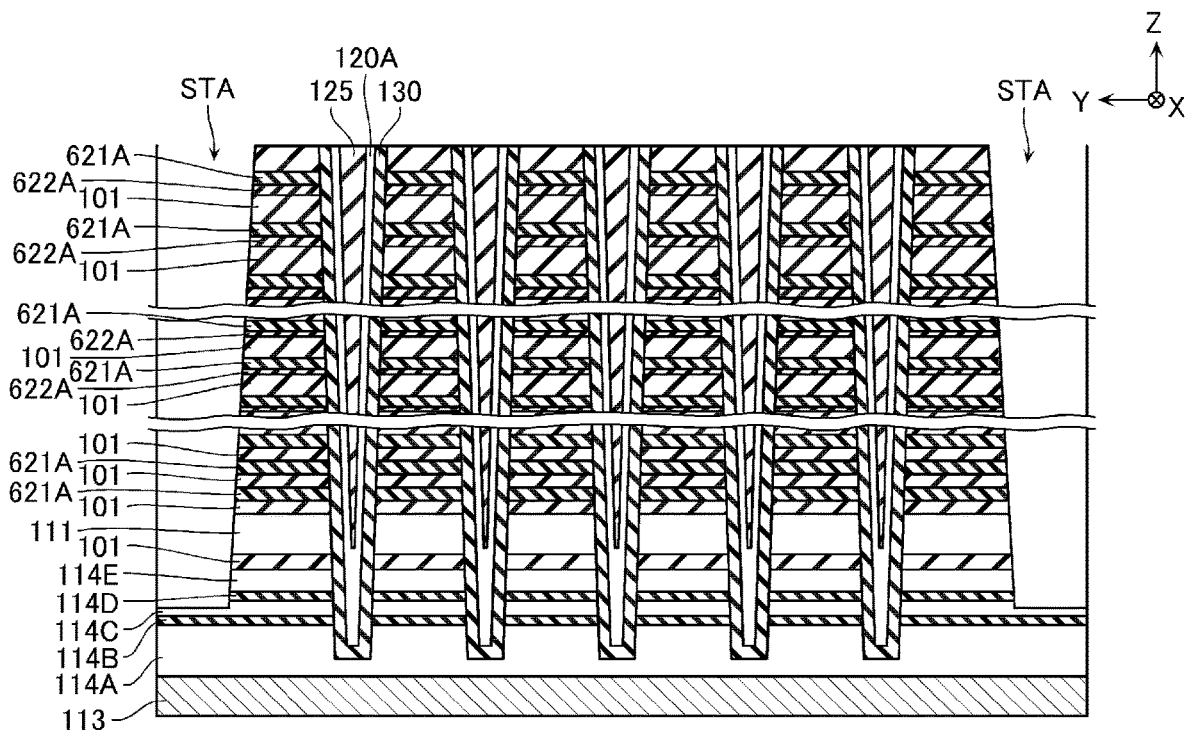
FIG. 20 is a schematic cross-sectional view showing the manufacturing method.

Next, as shown in FIG. 20, for example, openings STA extending in the X direction and the Z direction are formed penetrating the plurality of insulating layers 101 and the plurality of sacrificial layers 621A and 622A, the conductive layer 111, the semiconductor layer 114E, and the sacrificial layer 114D. This step is performed using the method such as RIE.

Figure 21:
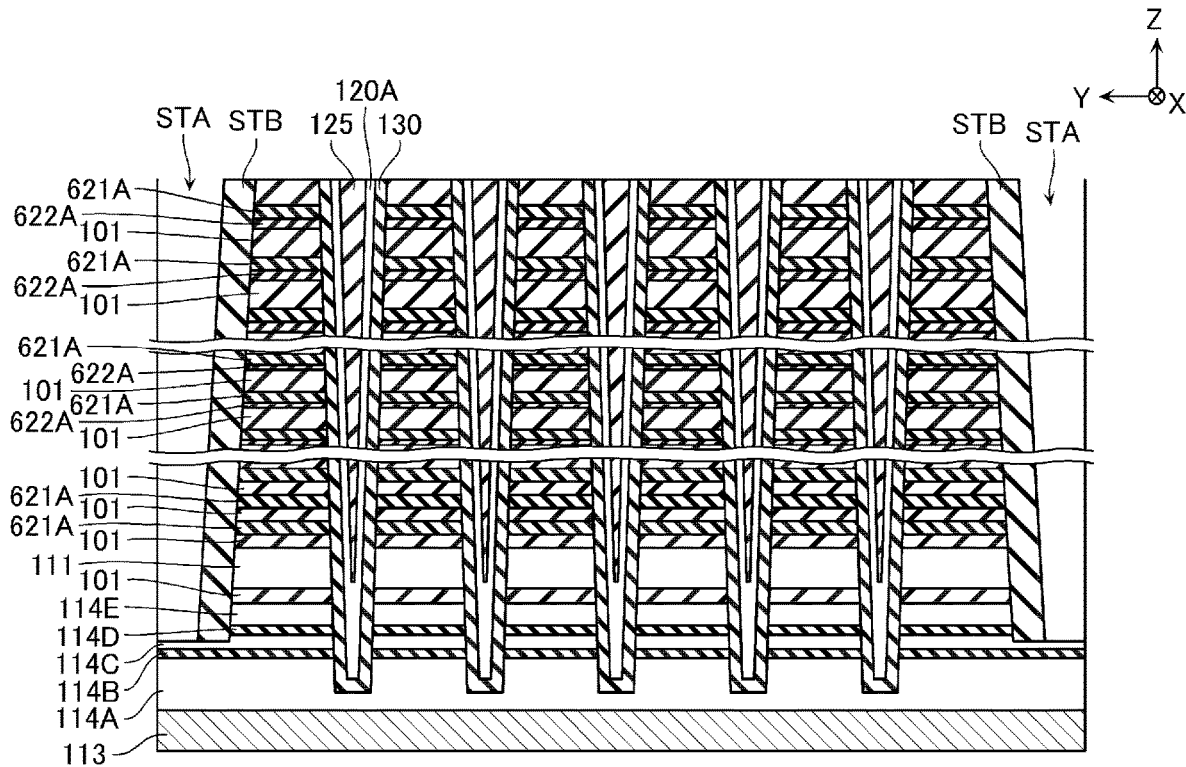
FIG. 21 is a schematic cross-sectional view showing the manufacturing method.

Next, as shown in FIG. 21, for example, protective films STB formed of silicon nitride or the like are formed on a side surface of the opening STA in the Y direction. This step is performed using the method such as CVD.

Figure 22:
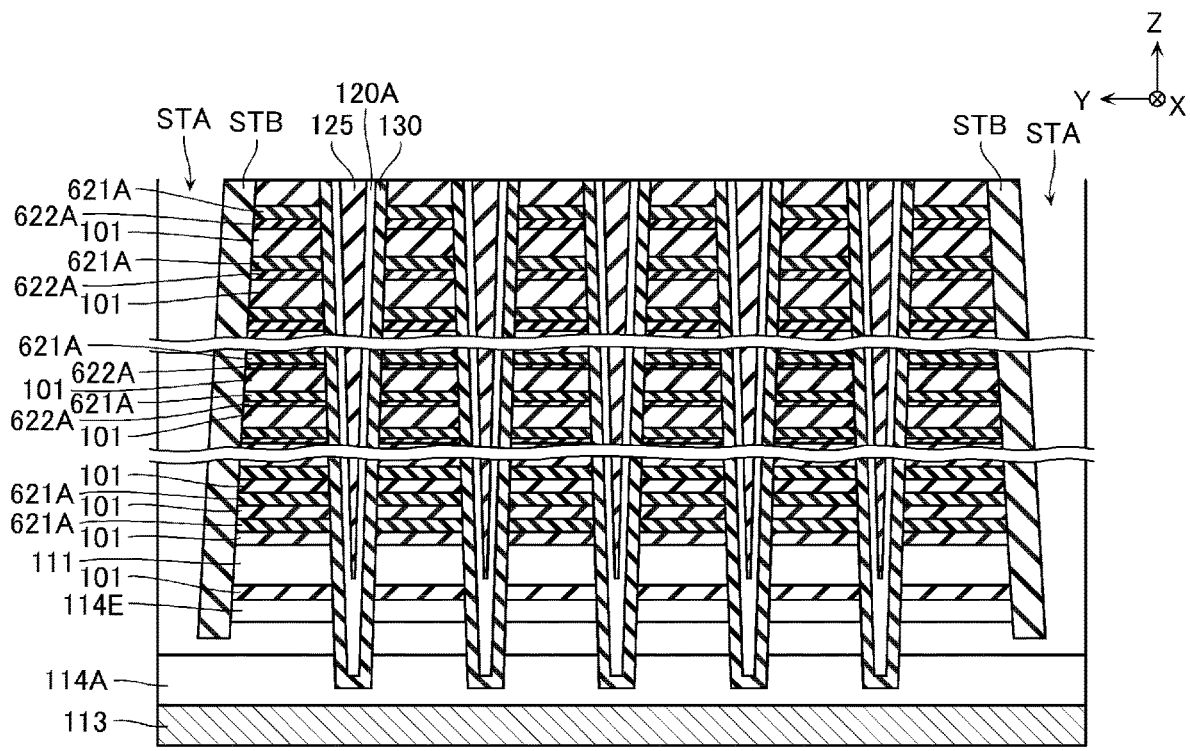
FIG. 22 is a schematic cross-sectional view showing the manufacturing method.

Next, as shown in FIG. 22, for example, the sacrificial layer 114C, the sacrificial layer 114B, and the sacrificial layer 114D are removed. This step is performed using a method such as wet etching.

Figure 23:
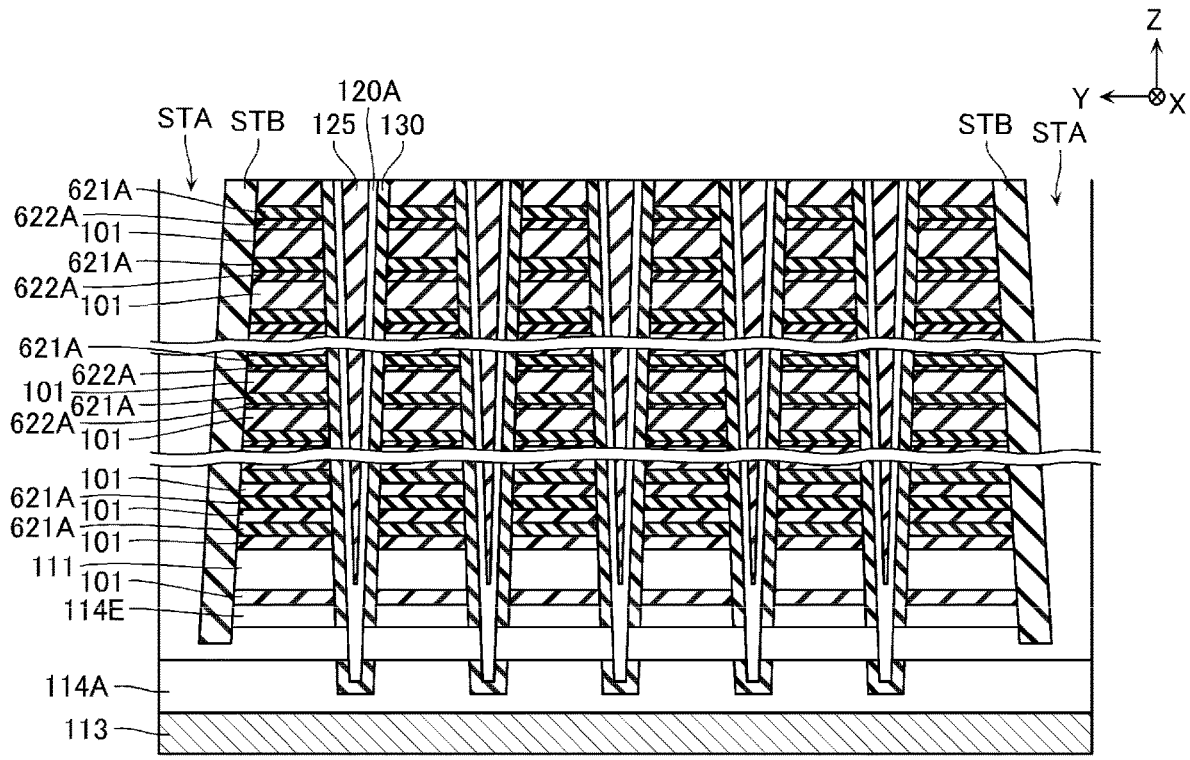
FIG. 23 is a schematic cross-sectional view showing the manufacturing method.

Next, as shown in FIG. 23, for example, a part of the gate insulating film 130 is removed. This step is performed using a method such as wet etching.

Figure 24:
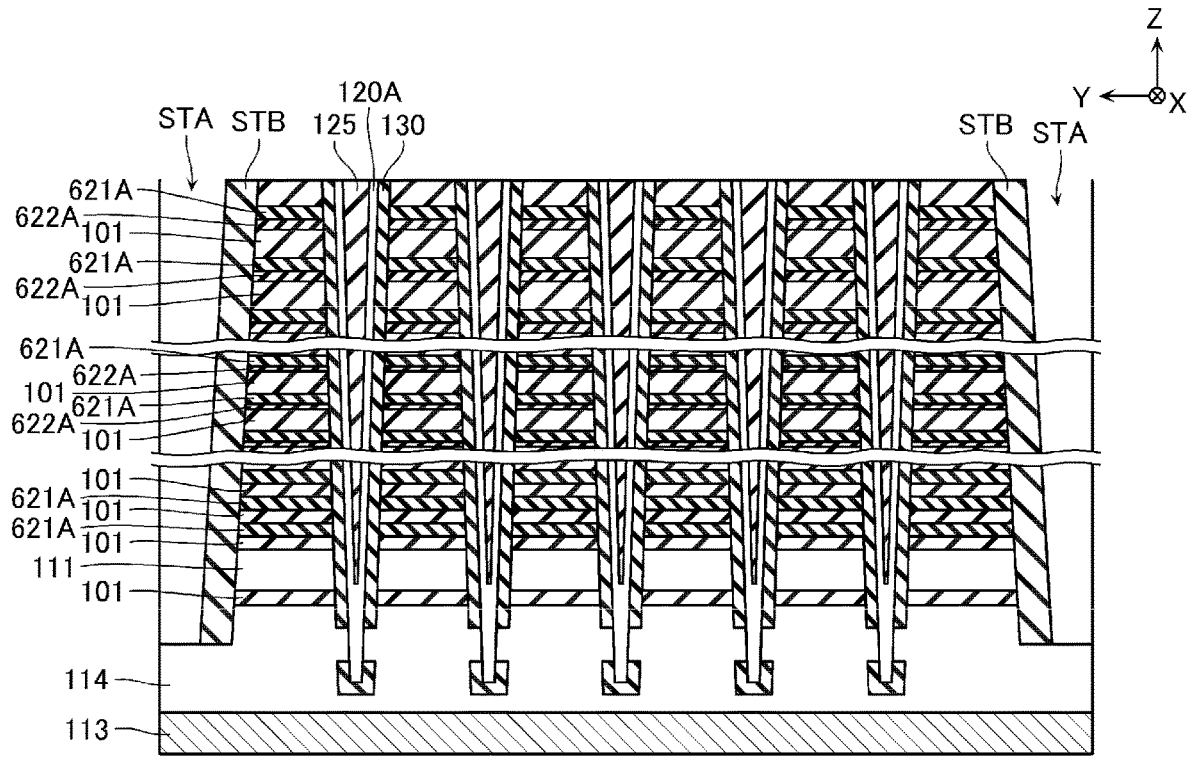
FIG. 24 is a schematic cross-sectional view showing the manufacturing method.

Next, as shown in FIG. 24, for example, the conductive layer 114 is formed. For example, silicon containing impurities such as phosphorus is formed on an upper surface of the semiconductor layer 114A and a lower surface of the semiconductor layer 114E using a method such as epitaxial growth.

Figure 25:
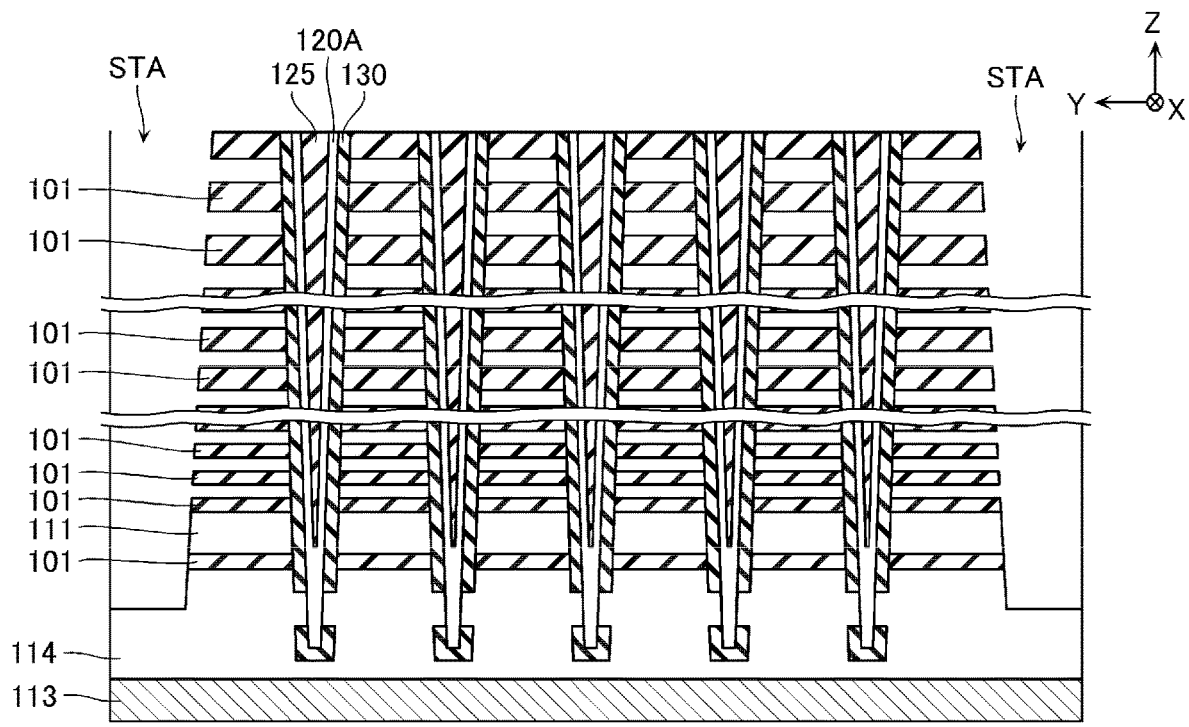
FIG. 25 is a schematic cross-sectional view showing the manufacturing method.

Next, as shown in FIG. 25, for example, the protective film STB is removed. This step is performed using the method such as wet etching.

Next, as shown in FIG. 25, for example, the sacrificial layers 621A and 622A are removed. This step is performed using a method such as wet etching using a chemical solution such as phosphoric acid.

Figure 26:
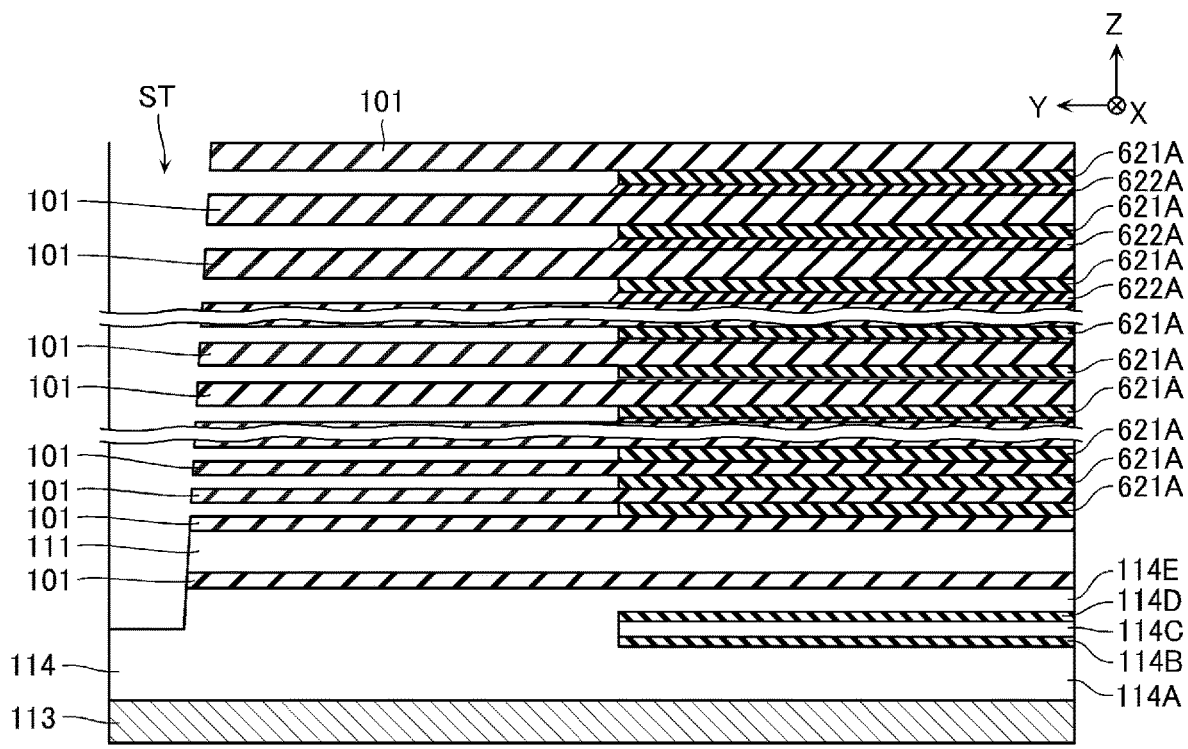
FIG. 26 is a schematic cross-sectional view showing the manufacturing method.

In this case, for example, as shown in FIG. 26, the sacrificial layers 621A and 622A formed in a part of the regions remain without being removed. The sacrificial layers 621A and 622A become the insulating layer 620.

Thereafter, the conductive layer 110 and a block structure insulating layer ST (FIG. 22) are formed using the method such as CVD. A sub block insulating layer SHE (FIG. 22) is formed using a method such as RIE and CVD. Accordingly, the structure described with reference to FIG. 4 and the like is formed.

Figure 27:
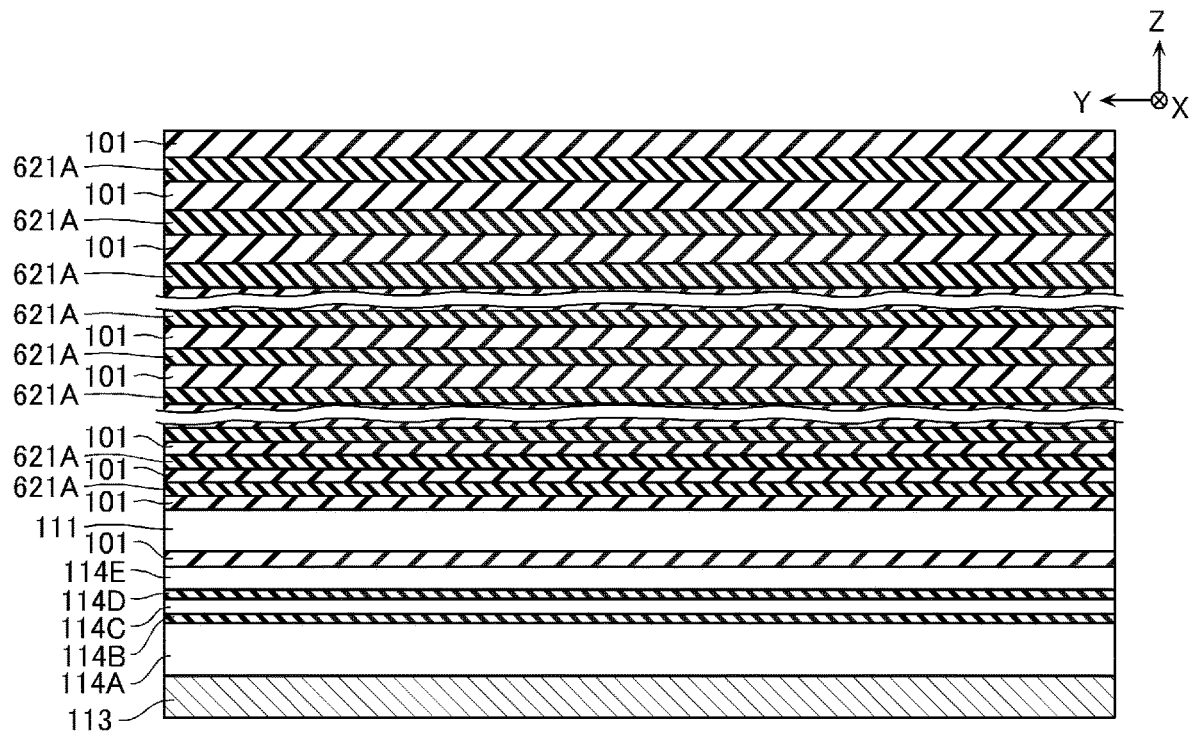
FIG. 27 is a schematic cross-sectional view showing a manufacturing method according to a comparative example.

FIG. 27 is a schematic cross-sectional view showing a manufacturing method according to a comparative example. The manufacturing method according to the comparative example is basically the same as the manufacturing method according to the sixth embodiment. However, in the sixth embodiment, the sacrificial layer 622A is not formed in the step corresponding to FIG. 16, and the sacrificial layer 621A is formed instead. The sacrificial layer 621A provided in an upper layer has a larger thickness in the Z direction.

Here, for example, in the steps described with reference to FIGS. 25 and 26, the sacrificial layer 621A is removed using the method such as wet etching. In this case, in an aspect shown in FIG. 27, the sacrificial layer 621A having a large thickness in the Z direction may be removed at a relatively high speed, and the sacrificial layer 621A having a small thickness in the Z direction may be removed at a relatively low speed.

Figure 28:
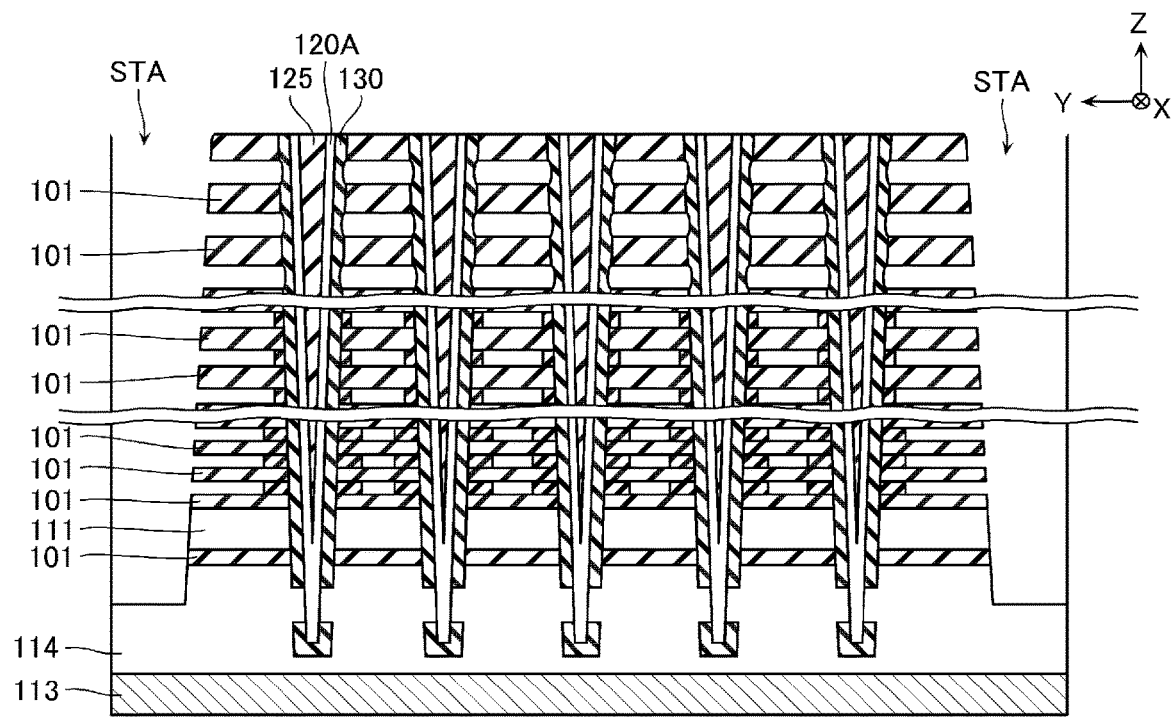
FIG. 28 is a schematic cross-sectional view showing the manufacturing method according to the comparative example.

In such an aspect, for example, as shown in FIG. 28, the sacrificial layer 621A located above may be completely removed before the sacrificial layer 621A located below is removed, the gate insulating film 130 may be exposed to the chemical solution for wet etching for a long time, and film quality of the gate insulating film 130 may deteriorate.

Thus, as described with reference to FIG. 16, a single-layer film of the sacrificial layer 621A is used for a part located relatively below, and a stacked film including the sacrificial layer 621A and the sacrificial layer 622A having an etching rate smaller than that of the sacrificial layer 621A is used for a part located relatively above. The thicknesses $T_{621}$ (FIG. 15) of the sacrificial layers 621A in the Z direction are substantially the same.

Figure 29:
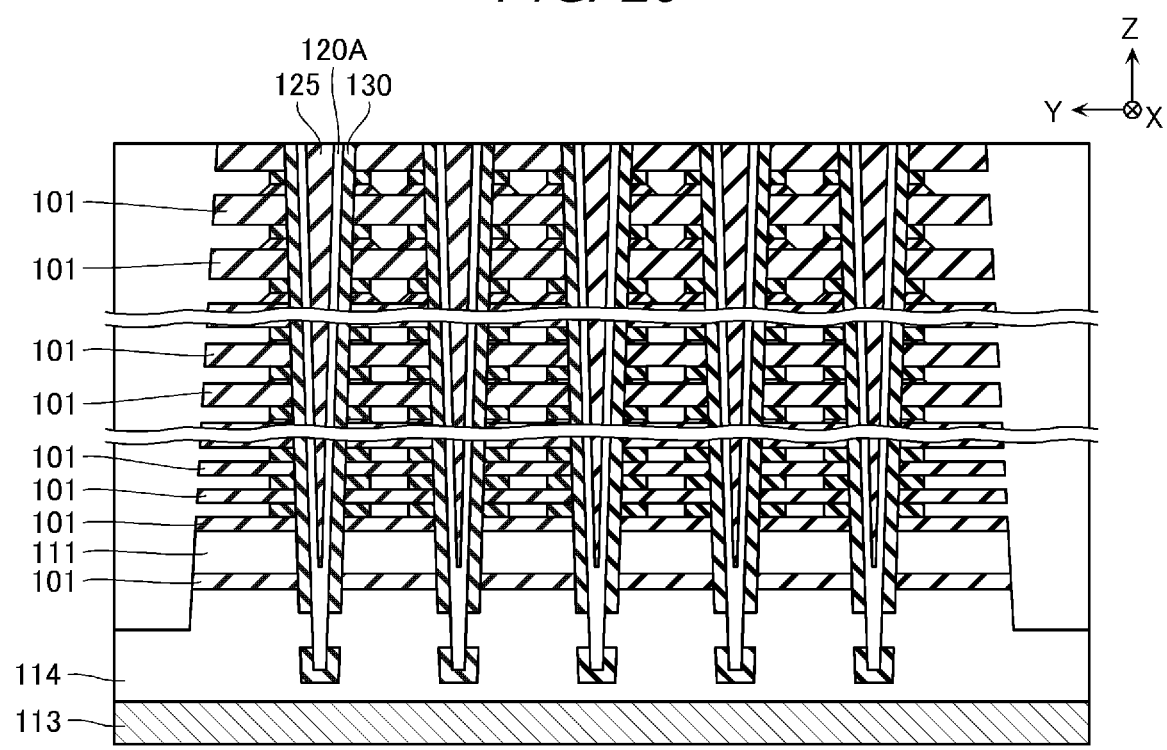
FIG. 29 is a schematic cross-sectional view showing the method for manufacturing the semiconductor storage device according to the sixth embodiment.

According to such a method, for example, as shown in FIG. 29, an etching speed can be made uniform between the sacrificial layer 621A located below and the sacrificial layer 621A located above. Accordingly, deterioration of the film quality of the gate insulating film 130 can be reduced.

Figure 11:
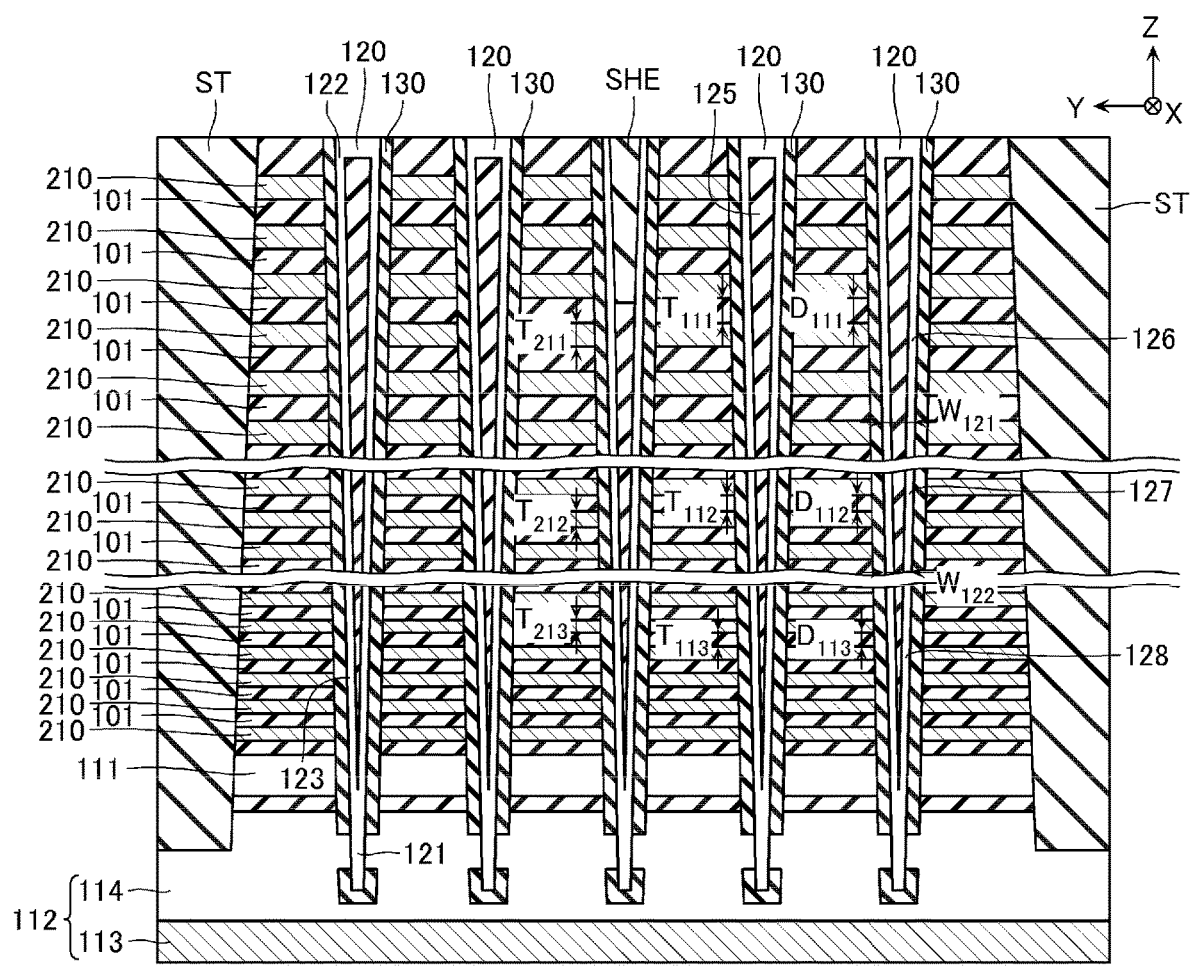
FIG. 11 is a schematic cross-sectional view of a semiconductor storage device according to a second embodiment.

In the above example, the semiconductor storage device including the memory cell array MCA having the structure shown in FIG. 11 and the structure shown in FIG. 15 is exemplified. However, the semiconductor storage device according to at least one embodiment may include, for example, a memory cell array MCA having the structure as shown in FIG. 13. In such a case, the number of the conductive layers 610 and the insulating layers 601 that are arranged in the Z direction and the thicknesses of the conductive layers 610 and the insulating layers 601 in the Z direction are equal to the number of the conductive layers 410 and the insulating layers 101 that are arranged in the Z direction, and the thicknesses of the conductive layers 410 and the insulating layers 101 in the Z direction, respectively. The number of the insulating layers 620 and the insulating layers 601 that are arranged in the Z direction and the thicknesses of the insulating layers 620 and the insulating layers 601 in the Z direction are equal to the number of the conductive layers 410 and the insulating layers 101 that are arranged in the Z direction, and the thicknesses of the conductive layers 410 and the insulating layers 101 in the Z direction, respectively.

Other Embodiments

The semiconductor storage device according to the first to sixth embodiments is described above. However, the semiconductor storage device according to these embodiments is merely an example, and specific configurations, operations, and the like can be appropriately adjusted.

For example, in the first to sixth embodiments, the thickness of the insulating layer 101 or the like in the Z direction is adjusted in three steps according to the variation in the outer diameter of the semiconductor layer 120 or the like. However, such an aspect is merely an example, and specific aspects can be appropriately adjusted. For example, the thickness of the insulating layer 101 or the like in the Z direction may be adjusted in two steps, or may be adjusted in four or more steps.

For example, in the second and fourth embodiments, the thickness of the conductive layer 210 or the like in the Z direction is adjusted in three steps according to the variation in the outer diameter of the semiconductor layer 120 or the like. However, such an aspect is merely an example, and specific aspects can be appropriately adjusted. For example, the thickness of the conductive layer 210 or the like in the Z direction may be adjusted in two steps, or may be adjusted in four or more steps.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a substrate;
a plurality of conductive layers arranged in a first direction intersecting a surface of the substrate, extending in a second direction intersecting the first direction, and functioning as a word line electrically connected to a memory cell; and
a semiconductor layer extending in the first direction and penetrating the plurality of conductive layers, wherein the semiconductor layer includes
  a first part disposed between one end portion of the semiconductor layer in the first direction and the other end portion of the semiconductor layer in the first direction, and having a width in the second direction larger than a first width, and
  a second part disposed between the first part and the other end portion, and having a width in the second direction smaller than the first width,
the plurality of conductive layers include
  a first conductive layer facing the first part,
  a second conductive layer adjacent to the first conductive layer in the first direction,
  a third conductive layer adjacent to the second conductive layer in the first direction,
  a fourth conductive layer facing the second part,
  a fifth conductive layer adjacent to the fourth conductive layer in the first direction, and
  a sixth conductive layer adjacent to the fifth conductive layer in the first direction, and
when, a distance between the first conductive layer and the second conductive layer in the first direction is a first distance,
  a distance between the second conductive layer and the third conductive layer in the first direction is a second distance,
  a distance between the fourth conductive layer and the fifth conductive layer in the first direction is a third distance, and
  a distance between the fifth conductive layer and the sixth conductive layer in the first direction is a fourth distance,
the third distance and the fourth distance are smaller than the first distance and the second distance,
wherein;
  the semiconductor layer includes a third part disposed between the first part and one end portion of the semiconductor layer in the first direction, and having a width in the second direction smaller than the first width,
  the plurality of conductive layers include
    a seventh conductive layer facing the third part, and
    an eighth conductive layer adjacent to the seventh conductive layer in the first direction, and
  when a distance between the seventh conductive layer and the eighth conductive layer in the first direction is a fifth distance,
  the fifth distance is smaller than the first distance.

2. The semiconductor storage device according to claim 1, wherein
when, a thickness of the first conductive layer in the first direction is a first thickness,
  a thickness of the second conductive layer in the first direction is a second thickness,
  a thickness of the third conductive layer in the first direction is a third thickness,
  a thickness of the fourth conductive layer in the first direction is a fourth thickness, a thickness of the fifth conductive layer in the first direction is a fifth thickness, and
a thickness of the sixth conductive layer in the first direction is a sixth thickness,
the fourth thickness, the fifth thickness, and the sixth thickness are smaller than the first thickness, the second thickness, and the third thickness.

3. The semiconductor storage device according to claim 1, wherein
when, a thickness of the first conductive layer in the first direction is a first thickness,
a thickness of the second conductive layer in the first direction is a second thickness,
a thickness of the seventh conductive layer in the first direction is a seventh thickness, and
a thickness of the eighth conductive layer in the first direction is an eighth thickness,
the seventh thickness and the eighth thickness are smaller than the first thickness and the second thickness.

4. The semiconductor storage device according to claim 1, further comprising:
a plurality of other conductive layers arranged in the first direction and extending in the second direction; and
a plurality of insulating layers arranged in the first direction and extending in the second direction, wherein
when, among the plurality of conductive layers in a first group,
an a-th (a is a natural number) conductive layer in the first group is the first conductive layer,
an (a+1)-th conductive layer in the first group is the second conductive layer, and
an (a+2)-th conductive layer in the first group is the third conductive layer,
among the plurality of other conductive layers in a second group,
an a-th conductive layer in the second group is a ninth conductive layer,
an (a+1)-th conductive layer in the second group is a tenth conductive layer, and
an (a+2)-th conductive layer in the second group is an eleventh conductive layer, and
among the plurality of insulating layers,
an a-th insulating layer is a first insulating layer,
an (a+1)-th insulating layer is a second insulating layer, and
an (a+2)-th insulating layer is a third insulating layer,
the first insulating layer includes a first insulating film and a second insulating film that are connected to the ninth conductive layer in at least one of the second direction or a third direction intersecting the first direction and the second direction,
the second insulating layer includes a third insulating film and a fourth insulating film that are connected to the tenth conductive layer in at least one of the second direction or the third direction, and
the third insulating layer includes a fifth insulating film and a sixth insulating film that are connected to the eleventh conductive layer in at least one of the second direction or the third direction.

5. The semiconductor storage device according to claim 4, wherein,
when, among the plurality of conductive layers in a third group,
a b-th (b is a natural number) conductive layer in the third group is the fourth conductive layer,
a (b+1)-th conductive layer in the third group is the fifth conductive layer, and
a (b+2)-th conductive layer in the third group is the sixth conductive layer,
among the plurality of other conductive layers in a fourth group,
a b-th conductive layer in the fourth group is a twelfth conductive layer,
a (b+1)-th conductive layer in the fourth group is a thirteenth conductive layer, and
a (b+2)-th conductive layer in the fourth group is a fourteenth conductive layer, and
among the plurality of insulating layers,
a b-th insulating layer is a fourth insulating layer,
a (b+1)-th insulating layer is a fifth insulating layer, and
a (b+2)-th insulating layer is a sixth insulating layer,
at least one of the fourth insulating layer, the fifth insulating layer, or the sixth insulating layer includes a seventh insulating film and an eighth insulating film that are connected to the twelfth conductive layer, the thirteenth conductive layer, and the fourteenth conductive layer in at least one of the second direction or the third direction, and
a thickness of the eighth insulating film in the first direction is smaller than a thickness of the second insulating film in the first direction, a thickness of the fourth insulating film in the first direction, and a thickness of the sixth insulating film in the first direction.

6. The semiconductor storage device according to claim 4, wherein,
when, among the plurality of conductive layers in a third group,
a b-th (b is a natural number) conductive layer in the third group is the fourth conductive layer,
a (b+1)-th conductive layer in the third group is the fifth conductive layer, and
a (b+2)-th conductive layer in the third group is the sixth conductive layer,
among the plurality of other conductive layers in a fourth group,
a b-th conductive layer in the fourth group is a twelfth conductive layer,
a (b+1)-th conductive layer in the fourth group is a thirteenth conductive layer, and
a (b+2)-th conductive layer in the fourth group is a fourteenth conductive layer, and
among the plurality of insulating layers,
a b-th insulating layer is a fourth insulating layer,
a (b+1)-th insulating layer is a fifth insulating layer, and
a (b+2)-th insulating layer is a sixth insulating layer,
at least one of the fourth insulating layer, the fifth insulating layer, or the sixth insulating layer is a single-layer film formed of a seventh insulating film that are connected to the twelfth conductive layer, the thirteenth conductive layer, and the fourteenth conductive layer in at least one of the second direction or the third direction.

7. The semiconductor storage device according to claim 4, wherein
the second insulating film and the fourth insulating film have at least one of a density higher than that of the first insulating film and the third insulating film, a content of hydrogen smaller than that of the first insulating film and the third insulating film, or an etching rate of a first chemical solution smaller than that of the first insulating film and the third insulating film.

* * * * *